(12) United States Patent
Nondhasitthichai et al.

(10) Patent No.: US 9,741,642 B1
(45) Date of Patent: Aug. 22, 2017

(54) SEMICONDUCTOR PACKAGE WITH PARTIAL PLATING ON CONTACT SIDE SURFACES

(71) Applicant: UTAC Headquarters PTE. LTD., Singapore (SG)

(72) Inventors: Somchai Nondhasitthichai, Bangkok (TH); Saravuth Sirinorakul, Bagkok (TH); Woraya Benjasukul, Bangkok (TH)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 15/042,050

(22) Filed: Feb. 11, 2016

Related U.S. Application Data

(63) Continuation-in-part of application No. 14/706,864, filed on May 7, 2015.

(60) Provisional application No. 62/126,262, filed on Feb. 27, 2015, provisional application No. 61/990,040, filed on May 7, 2014.

(51) Int. Cl.
*H01L 23/495* (2006.01)
*H01L 23/31* (2006.01)

(52) U.S. Cl.
CPC .... *H01L 23/49541* (2013.01); *H01L 23/3114* (2013.01); *H01L 23/49503* (2013.01)

(58) Field of Classification Search
CPC ............. H01L 23/3107; H01L 23/4952; H01L 23/49524; H01L 23/49582
See application file for complete search history.

(56) References Cited

U.S. PATENT DOCUMENTS

| | | | |
|---|---|---|---|
| 6,660,626 B1 | 12/2003 | Lin | |
| 6,969,638 B2 | 11/2005 | Estepa et al. | |
| 7,320,937 B1 | 1/2008 | Pal et al. | |
| 8,084,299 B2 | 12/2011 | Tan | |
| 2002/0130400 A1* | 9/2002 | Jeong | H01L 21/565 257/670 |
| 2008/0246132 A1 | 10/2008 | Kasuya et al. | |

(Continued)

OTHER PUBLICATIONS

Office Action dated Jun. 15, 2016, U.S. Appl. No. 14/706,864, filed May 7, 2015, Somchai Nondhasitthichai et al.et al., 18 pages.

(Continued)

*Primary Examiner* — William F Kraig
*Assistant Examiner* — Khatib Rahman
(74) *Attorney, Agent, or Firm* — Haverstock & Owens LLP

(57) ABSTRACT

Embodiments of the present invention are directed to a semiconductor package with partial plating on contact side surfaces. The semiconductor package includes a top surface, a bottom surface opposite the top surface, and side surfaces between the top and bottom surfaces. Contacts are located on peripheral edges of the bottom surface. Each of the contacts includes a first surface that is flush with the bottom surface, a second surface that is flush with one of the side surfaces, and a third surface between the first surface and the second surface. Each of the side surfaces can include a step such that the area of the bottom surface is differently sized from the area of the top surface and the third surface is located at the step. The first surface is plated, while the second surface is exposed (not plated). At least a portion of the third surface is plated.

21 Claims, 29 Drawing Sheets

(56) References Cited

U.S. PATENT DOCUMENTS

2009/0026590 A1* 1/2009 Lim .................. H01L 21/568
                                                    257/670
2011/0244629 A1* 10/2011 Gong ................ H01L 21/4828
                                                    438/112

OTHER PUBLICATIONS

Office Action dated Jan. 11, 2017, U.S. Appl. No. 14/706,864, filed May 7, 2015, Somchai Nondhasitthichai et al.et al., 35 pages.

* cited by examiner

Bottom side of the package

Top side of the package

Cross Section

Bottom side of the package

Top side of the package

Cross Section

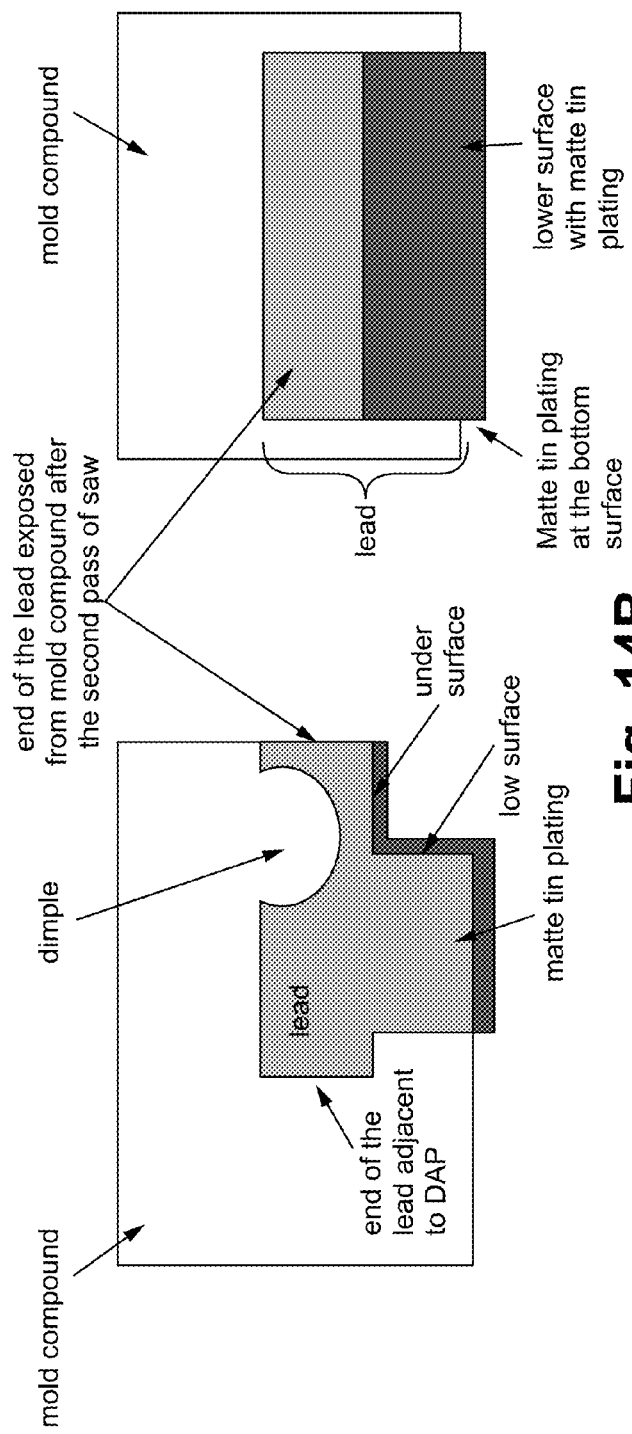
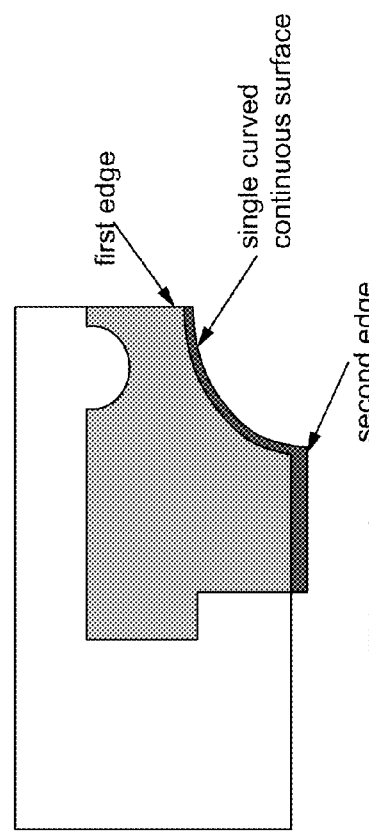
Fig. 14B
Fig. 15

SEMICONDUCTOR PACKAGE WITH PARTIAL PLATING ON CONTACT SIDE SURFACES

RELATED APPLICATIONS

This application claims benefit of priority under 35 U.S.C. §119(e) of the U.S. Provisional Patent Application Ser. No. 62/126,262, filed Feb. 27, 2015, entitled "Semiconductor Package with Partial Plated on Side Terminals," which is hereby incorporated by reference in its entirety This application is a Continuation In Part and claims priority under 35 U.S.C. §120 of the co-pending U.S. patent application Ser. No. 14/706,864, filed May 7, 2015, entitled "A Semiconductor Package with Partial Plating on Contact Side Surfaces," which in turn claims benefit of priority under 35 U.S.C. §119(e) of the U.S. Provisional Patent Application Ser. No. 61/990,040, filed May 7, 2014, entitled "Semiconductor Package with Partial Plated on Side Terminals," and of the U.S. Provisional Patent Application Ser. No. 62/126, 262, filed Feb. 27, 2015, entitled "Semiconductor Package with Partial Plated on Side Terminals," which are all hereby incorporated by reference in their entirety.

FIELD OF INVENTION

The present invention is related to the field of semiconductor package manufacturing. More specifically, the present invention relates to a semiconductor package with partial plating on contact side surfaces.

BACKGROUND OF THE INVENTION

A semiconductor device array contains individual integrated circuits or semiconductor packages. Contacts of the semiconductor packages are exposed at the bottom of the semiconductor array. The contacts are typically made of copper. To prevent oxidation on the copper surface, the contacts are plated with a lead finished material, such as matte tin (Sn), using electroplating. As a result, the bottom surfaces of the contacts are thereafter tin plated.

Singulation is a process of separating each semiconductor package from a molded sheet. Dicing or sawing is a process that singulates the semiconductor array into individual or singulated semiconductor packages. Conventionally, the electroplated semiconductor array is diced into singulated semiconductor packages to be shipped to customers for assembly onto printed circuit boards. The singulation of the semiconductor packages result in contacts on peripheral edges of the singulated semiconductor packages.

FIG. 1 illustrates a singulated semiconductor package 100 having a plurality of contacts 105 on peripheral edges of the singulated semiconductor package. Although the bottoms of the contacts 105a are tin plated, sidewalls 105b of the contacts 105b are exposed (e.g., without tin plating), because the singulation occurred after the semiconductor array was electroplated with the lead finished material. If the singulated semiconductor package 100 is stored in inappropriate environments and/or conditions (e.g., moisture in the air, acids, bases, salts, oils, aggressive metal polished, and other solid and liquid chemicals) after singulation, then the exposed surfaces 105b become sites for potential corrosion 110 such as copper oxide. This aging process is known as oxidation. The exposed surfaces 105b, usually deposited with pollutant layers of oxide and other nonmetallic compound 110, often interfere with or inhibit solder wettability. The resulting oxide layer reduces solderability because contamination 110 prevents the metal from soldering well. The rate of oxidation can increase with an increase in temperature or humidity. Solder problems are a common cause for device failures.

A perfectly clean surface is required for assembly of the singulated semiconductor packages 100 onto a substrate, such as a printed circuit board. Since metal oxides form a barrier that prevents molten solder from forming a true metallurgical bond, the metal oxides must be limited.

BRIEF SUMMARY OF THE INVENTION

Embodiments of the present invention are directed to a semiconductor package with partial plating on contact side surfaces. The semiconductor package includes a top surface, a bottom surface opposite the top surface, and side surfaces between the top and bottom surfaces. Contacts are located on peripheral edges of the bottom surface. Each of the contacts includes a first surface that is flush with the bottom surface, a second surface that is flush with one of the side surfaces, and a third surface between the first surface and the second surface. Each of the side surfaces can include a step such that the area of the bottom surface is differently sized from the area of the top surface and the third surface is located at the step. The first surface is plated, while the second surface is exposed (not plated). At least a portion of the third surface is plated.

In one aspect, a semiconductor package is provided. The semiconductor package includes a semiconductor die and a forming leadframe. The formed leadframe includes a plurality of contacts, each including an interfacing surface at a bottom of the semiconductor package, an interior surface that is opposite the interfacing surface and an exterior end surface that includes a first portion and a second portion. The first portion of the exterior end surface is non-adjacent to the interface surface. The semiconductor package also includes a molding compound encapsulating the semiconductor die and at least a portion of each of the plurality of contacts.

In some embodiments, the formed leadframe further includes tie bars and die attach pad coupled with the tie bars. In some embodiments, at a back side of the semiconductor package, the die attach pad is also plated.

In some embodiments, the semiconductor die is electrically coupled with the interior surface of the contact via wirebonds. Alternatively, the semiconductor die is electrically coupled with the interior surface of the contact via solder balls.

In some embodiments, the first portion of the exterior end surface is exposed and the interface surface is plated. In some embodiments, the semiconductor package also a step located at each side of the semiconductor device. The step can run the full length of each side of the semiconductor package.

In some embodiments, the second portion of the exterior end surface is located at the step and further includes a first subportion and a second subportion of the second portion of the exterior end surface. The first subportion of the second portion of the exterior end surface is perpendicular to and extends from the first portion of the exterior end surface. The second subportion of the second portion of the exterior end surface is perpendicular to and extends from the first subportion of the second portion of the exterior end surface to the interfacing surface.

In some embodiments, the area of a bottom surface of the semiconductor package is greater than the area of a top surface of the semiconductor package. The first subportion of the second portion of the exterior end surface is exposed and the second subportion of the second portion of the exterior end surface is plated. In some embodiments, the semiconductor package also includes a dimple formed on a top side of each contact.

Alternatively, the area of a top surface of the semiconductor package is greater than the area of a bottom surface of the semiconductor package. The first subportion and the second subportion of the second portion of the exterior end surface are both plated. In some embodiments, the semiconductor package also includes a dimple formed on a top side of each contact.

In some embodiments, the second portion of the exterior end surface is located at the step and is a curved continuous surface and is plated. In some embodiments, the semiconductor package also includes a dimple formed on a top side of each contact.

In some embodiments, the second portion of the exterior end surface is platted and extends from the first portion of the exterior end surface to the interfacing surface. In some embodiments, the semiconductor package also includes a dimple formed on a top side of each contact.

In another aspect, a semiconductor package is provided. The semiconductor package includes a semiconductor die and a formed leadframe. The formed leadframe includes a plurality of contacts, each including an interfacing surface at a bottom of the semiconductor package, an interior surface that is opposite the interfacing surface and an exterior end surface that includes a first portion and a second portion. The first portion of the exterior end surface is non-adjacent to the interface surface. The semiconductor package also includes a molding compound encapsulating the semiconductor die and at least a portion of each of the plurality of contacts.

In some embodiments, the semiconductor package also includes one continuous plating layer directly adhering to the interfacing surface and the entirety of the second portion of the exterior end surface.

In some embodiments, the second portion of the exterior end surface includes a first subportion and a second subportion of the second portion of the exterior end surface. The first subportion of the second portion of the exterior end surface is perpendicular to and extends from the first portion of the exterior end surface. The second subportion of the second portion of the exterior end surface is perpendicular to and extends from the first subportion of the second portion of the exterior end surface to the interfacing surface. In some embodiments, the semiconductor package also includes one continuous plating layer directly adhering to the interfacing surface and the second subportion of the second portion of the exterior end surface.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 14A-14C illustrate other exemplary singulated semiconductor devices according to some embodiments.

FIG. 15 illustrates a partial cross-sectional view of yet another singulated semiconductor device according to some embodiments.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Figure 1:
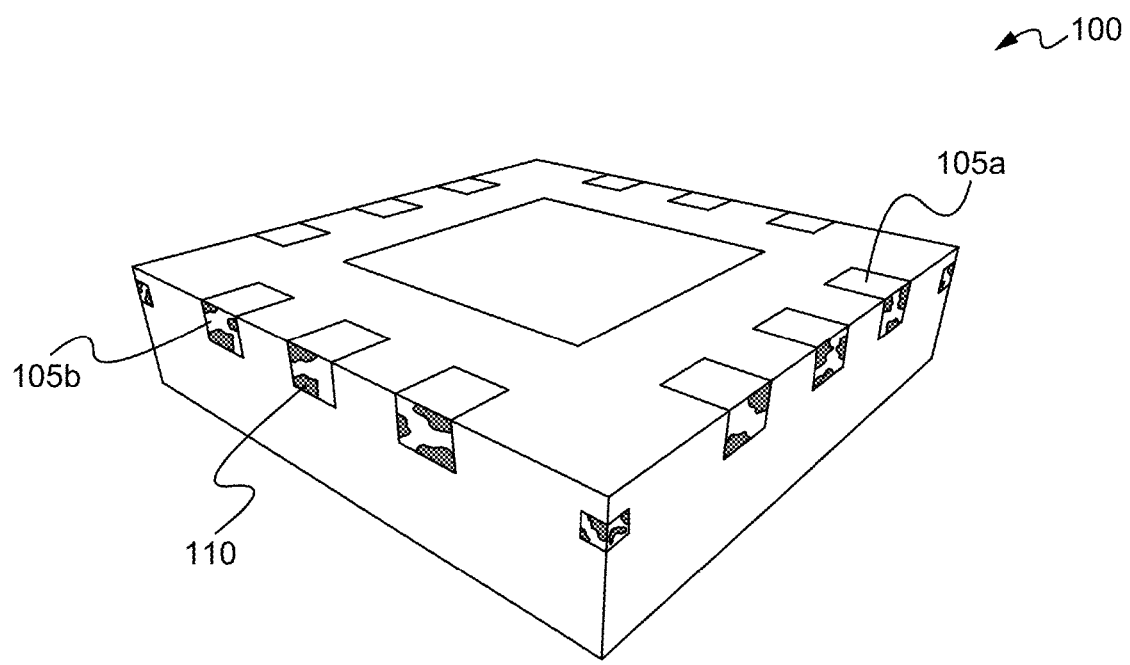
FIG. 1 illustrates a singulated semiconductor package having a plurality of contacts on peripheral edges of the singulated semiconductor package.
Figure 2:
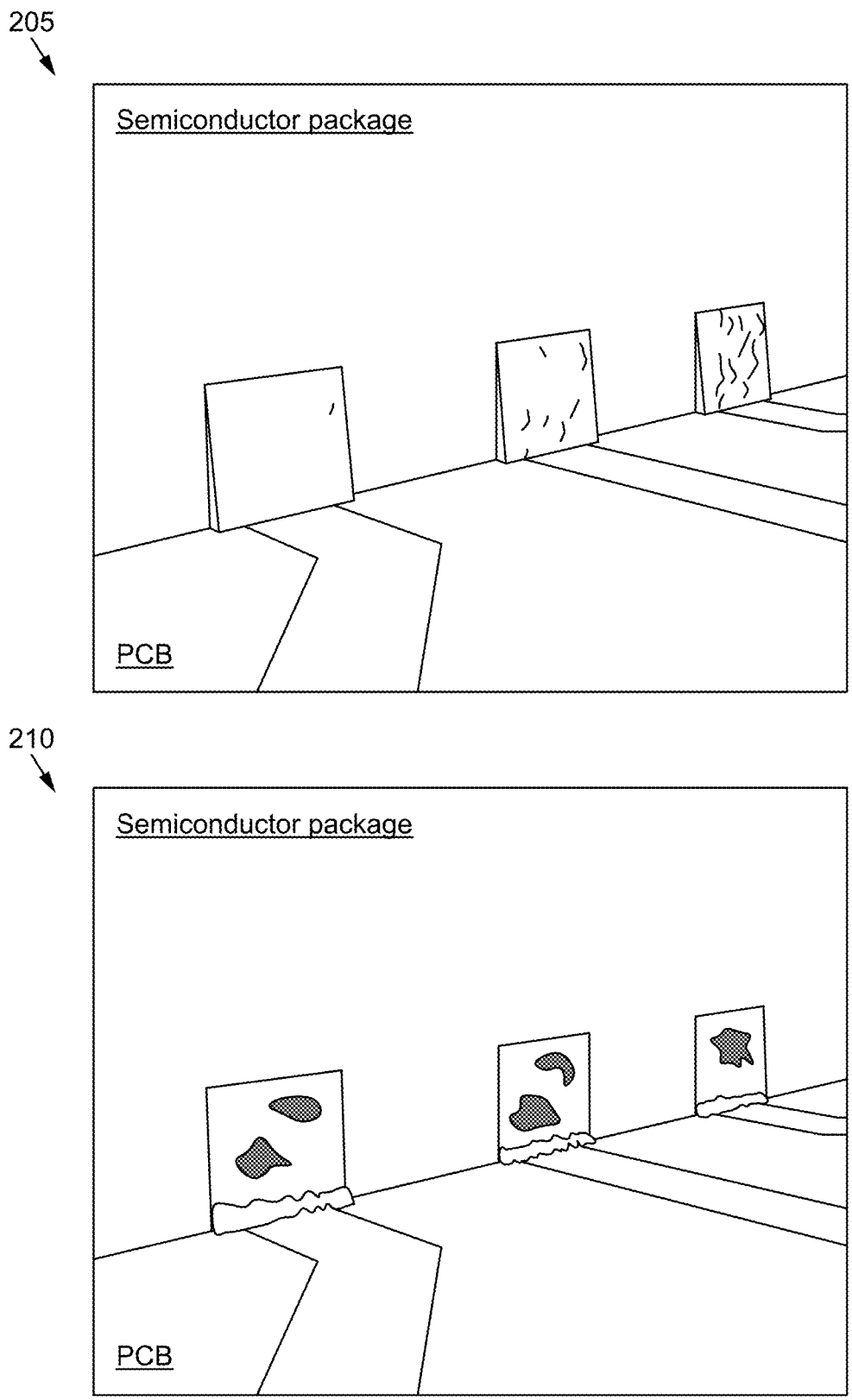
FIG. 2 illustrates two exemplary pictures, each of a package soldered on a PCB.

In a conventional semiconductor package, such as the semiconductor package 100 of FIG. 1, side surfaces of its contacts are not plated. When the semiconductor package is soldered to a substrate, such as a printed circuit board (PCB), an expected (such as complete) solder coverage on the side surfaces of the contacts of the semiconductor package is preferred since such coverage ensures the quality of the soldering to the PCB. If there is an unexpected (such as lack of) solder coverage on the side surfaces of the contacts of the semiconductor package, then there could be issues with the soldering. As discussed in the Background of the Invention section of the present application, metal oxide on the copper surfaces of the contacts prevents sufficient solder coverage on the copper surfaces during soldering. Plating metal, such as matted tin, on the copper surfaces can prevent the occurrence of metal oxide on the surfaces. The solder can "move" to cover the plated metal surfaces when the semiconductor package is being soldered to the PCB. FIG. 2 illustrates two exemplary pictures, each of a semiconductor package soldered on a PCB. The picture 205 on the left shows complete solder coverage on the side surfaces of the contacts, while the picture on the right 210 shows unexpected solder coverage on the side surfaces of the contacts.

By visual inspection, complete solder coverage on the contacts can ensure quality of the soldering, while unexpected solder coverage on the contacts can lead to questions regarding quality of the soldering. However, plating the side surfaces of contacts requires an additional processing step as these side surfaces are exposed upon singulation of the semiconductor package from other semiconductor packages.

Embodiments of the present invention are directed to a semiconductor package with partial plating on contact side surfaces. The semiconductor package includes a top surface, a bottom surface opposite the top surface, and side surfaces between the top and bottom surfaces. Contacts are located on peripheral edges of the bottom surface. Each of the contacts includes a first surface that is flush with the bottom surface, a second surface that is flush with one of the side surfaces, and a third surface between the first surface and the second surface. Each of the side surfaces can include a step such that the area of the bottom surface is differently sized from the area of the top surface and the third surface is located at the step. The first surface is plated, while the second surface is exposed (not plated). At least a portion of the third surface is plated.

A contact of the semiconductor package of the present invention includes a first surface, a second surface and a third surface. A side surface of the contact refers herein to the third surface and the second surface of the contact. As discussed below, no additional processing step is required to partially plate contact side surfaces. The semiconductor package with partial plating on its contact side surfaces ensures quality of soldering of the semiconductor package to a substrate, such as a PCB, even if unplated areas of the contact side surfaces are contaminated. It should be noted that the terms "contact," "terminal," and "connector" are used interchangeably herein. It should also be noted that the "sidewalls" of a contact and the "side surfaces" of a contact are used interchangeably herein.

Chemical Etching to Half Etch Leadframe

In some embodiments, a chemical etch is used on one side of a leadframe to half etch the leadframe and, then, a mechanical saw is used on the other side of the leadframe to half cut the leadframe, thereby singulating semiconductor packages from each other. In some embodiments, the chemical etching results in the third surface of each contact being curved.

Figure 3:
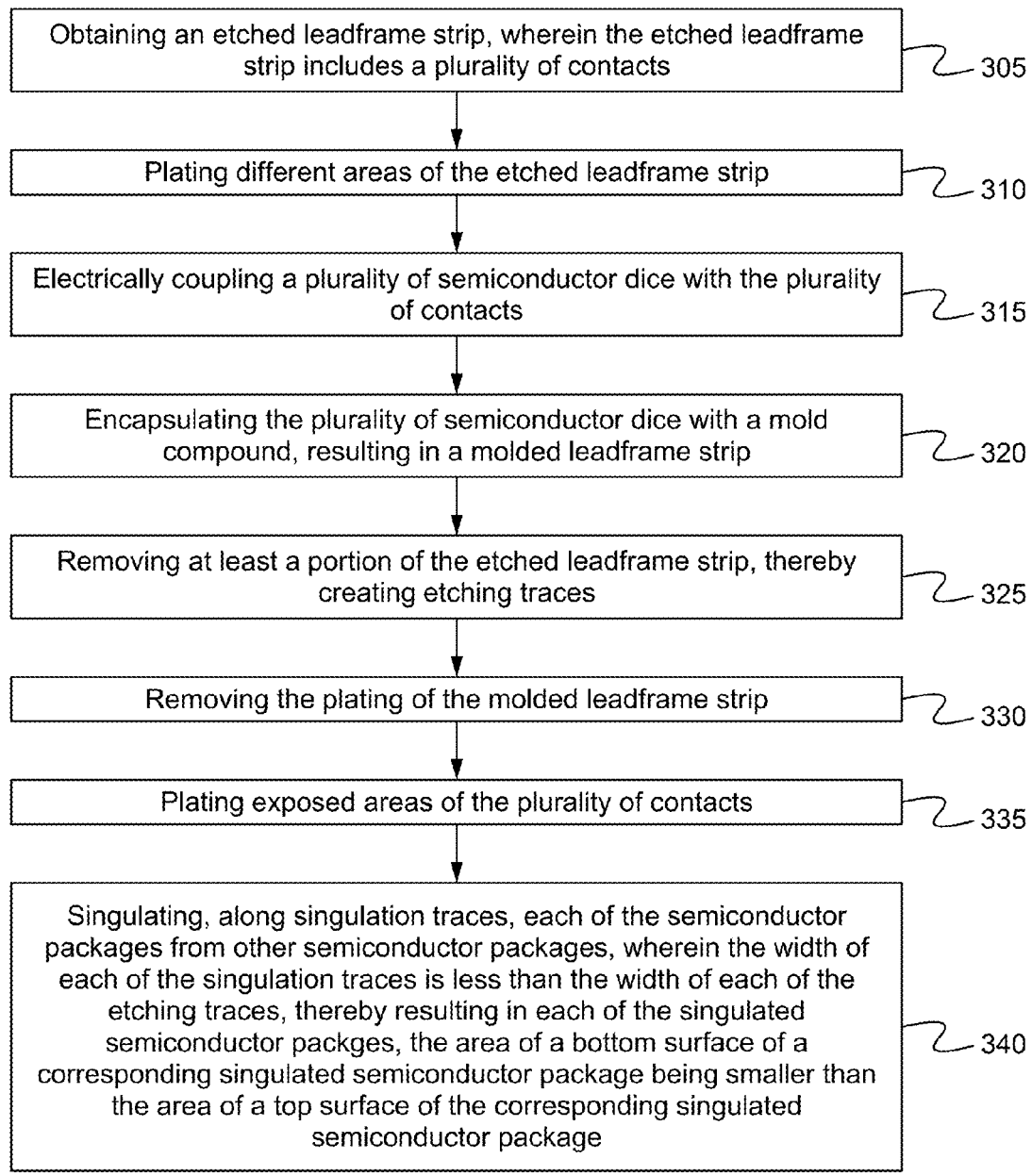
FIG. 3 illustrates an exemplary method of manufacturing semiconductor packages according to some embodiments.
Figure 4A:
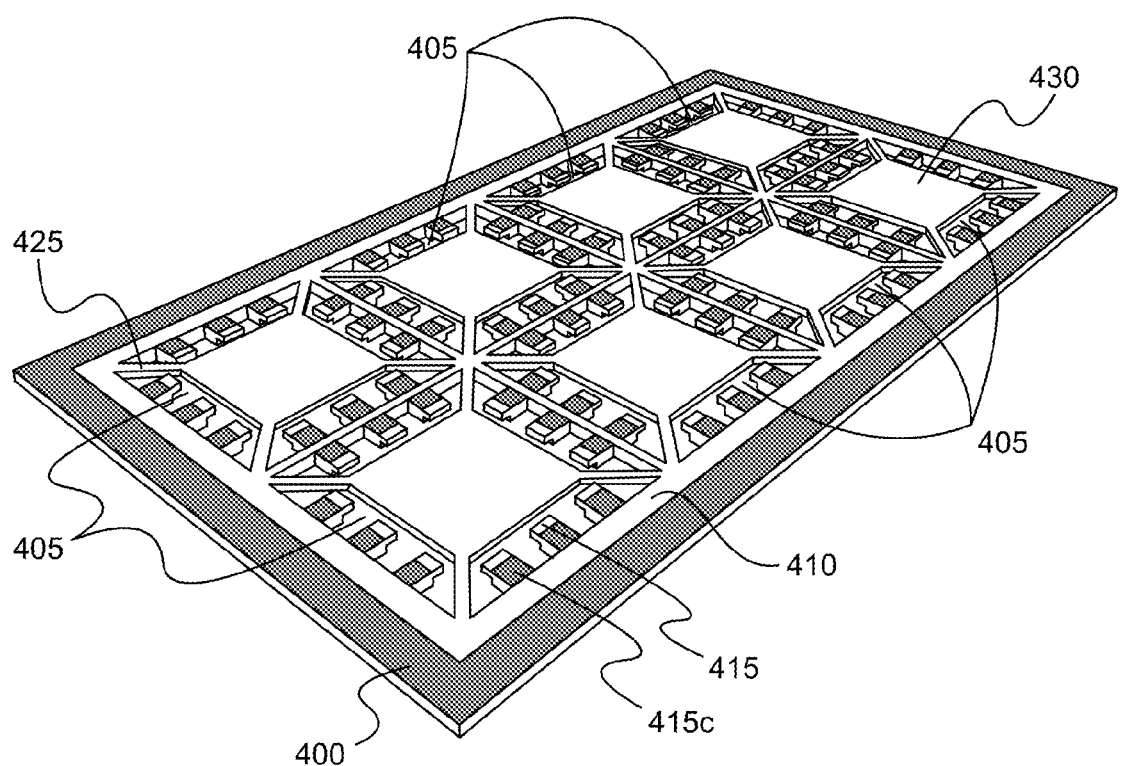
FIGS. 4A-4K illustrate an exemplary result produced at each step of the method of FIG. 3.
Figure 4B:
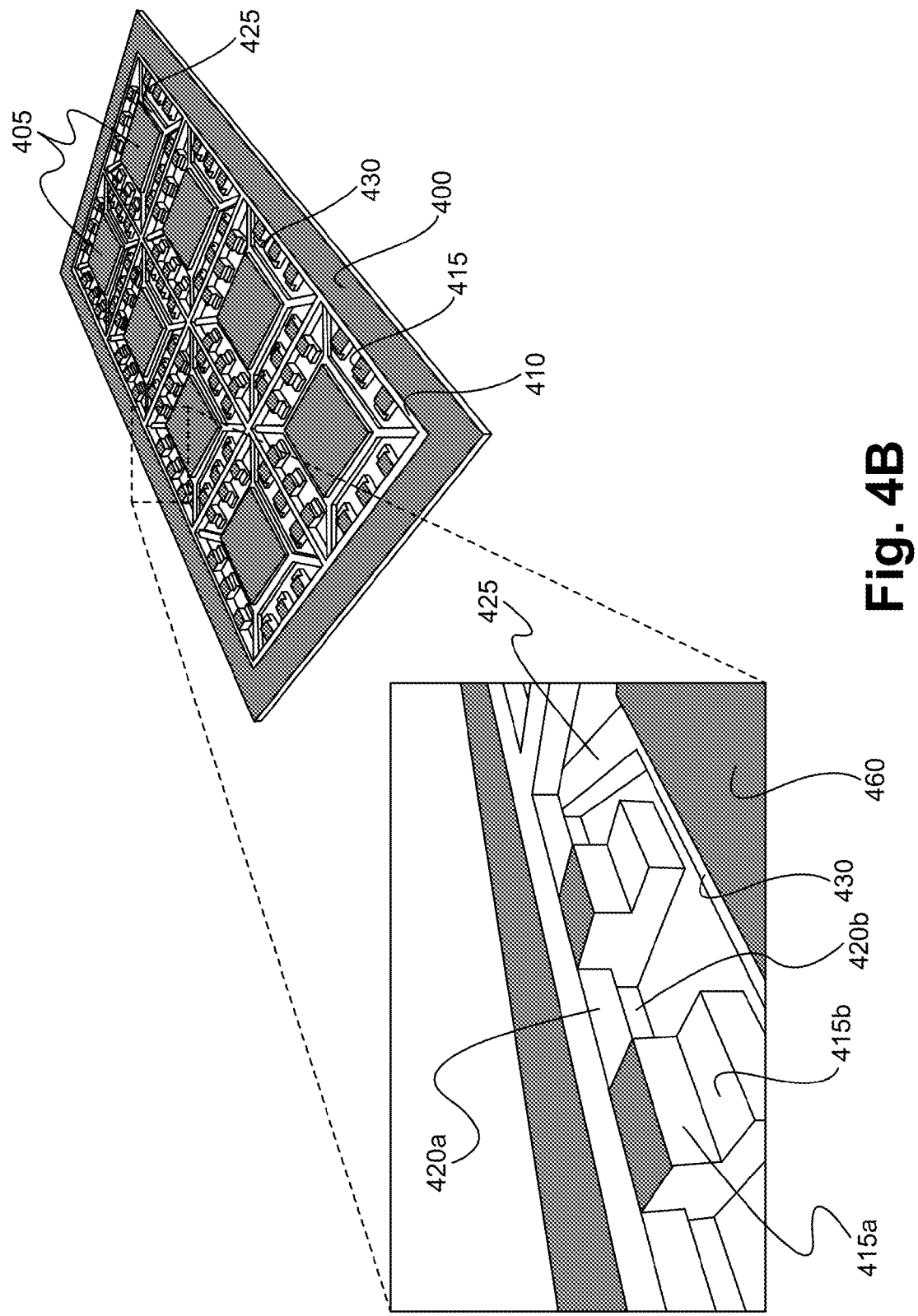

FIG. 3 illustrates an exemplary method 300 of manufacturing semiconductor packages according to some embodiments. An exemplary result produced by each step of the method 300 is illustrated in FIGS. 4A-4K. The method 300 begins at a Step 305, where an etched leadframe strip 400 is obtained. In some embodiments, the etched leadframe strip 400 is made of copper. FIG. 4A illustrates the front side (or top side) of the leadframe strip 400, while FIG. 4B illustrates the backside (or bottom side or contact side) of the leadframe strip 400. The leadframe strip 400 includes an array of device areas 405. Although the leadframe strip 400 is shown to include a 3×2 array of device areas 405, the array of device areas can be bigger or smaller.

Figure 7B:
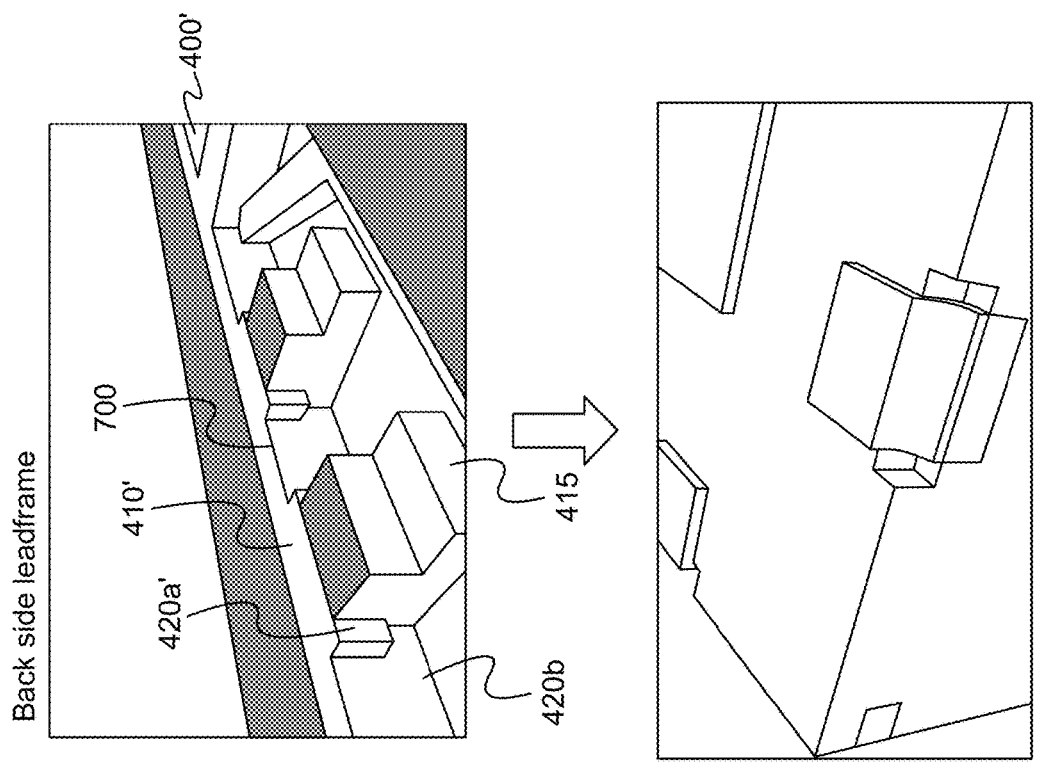
FIG. 7B illustrates a graphical explanation of how an alternate step portion of a molding compound is shaped according to some embodiments.

Each device area 405 includes dam bars 410 and contacts 415 coupled with the dam bars 410. The dam bars 410 enclose a corresponding device area 405. Each dam bar 410 includes a step 420 that is formed by an extruding portion 420a and a non-extruding portion 420b. As discussed elsewhere, the step 420 can continuously run or discretely run (as illustrated in FIG. 7B) the full length of a corresponding dam bar 405. The extruding portion 420a of the step 420 protrudes towards the center of the corresponding device area 405. As will become apparent, the extruding portion 420a and the non-extruding portion 420b will form a step portion in a molding compound around the contacts 415.

Each of the contacts 415 includes a first portion 415a that is coupled with the extruding portion 420a of the step 420, and a second portion 415b that is coupled with the non-extruding portion 420b of the step 420. In some embodiments, the second portion 415b extends further towards the center of the corresponding device area 405 than the first portion 415a does. Alternatively, the first portion 415a extends further towards the center of the corresponding device area 405 than the second portion 415b does. The different sizes of the first portion 415a and the second portion 415b act as a locking mechanism with the molding compound. Alternatively, edges of both the first portion 415a and the second portion 415b extending towards the center of the corresponding device area 405 are flush.

In some embodiments, the corresponding device area 405 further includes tie bars 425 and a die attach pad 430 coupled with the tie bars 425 such that the die attach pad 430 is suspended to the leadframe strip 400 in the corresponding device area 405 via the tie bars 425. In some embodiments, the tie bars 425 are coupled with the non-extruding portion 420b of the step 420.

At a Step 310, different areas of the etched leadframe strip 400 are plated. The different areas of the leadframe strip 400 include areas on the backside of the leadframe strip 400 and areas on the front side of the leadframe strip 400. On the backside of the leadframe strip 400, the first portions 415a of the contacts 415, the die attach pads 430 and a portion of the perimeter of the leadframe strip 400 are plated. On the front side of the leadframe strip 400, areas 415c of the second portions 415b of the contacts 415 and a portion of the perimeter of the leadframe strip 400 are plated. These area 415c of the second portions 415b of the contacts 415 are where semiconductor dice are electrically coupled with. In FIG. 4A, the area 415c of the second portions 415b abut the dam bars 410. The plated areas on the backside and the front side of the leadframe strip 400 will act as a chemical etching mask; as such, unplated areas will be etched away in a later etching step (e.g., Step 325). The plating material 460 can be Ag, Cu, NiPdAu, or other suitable material.

Figure 4C:
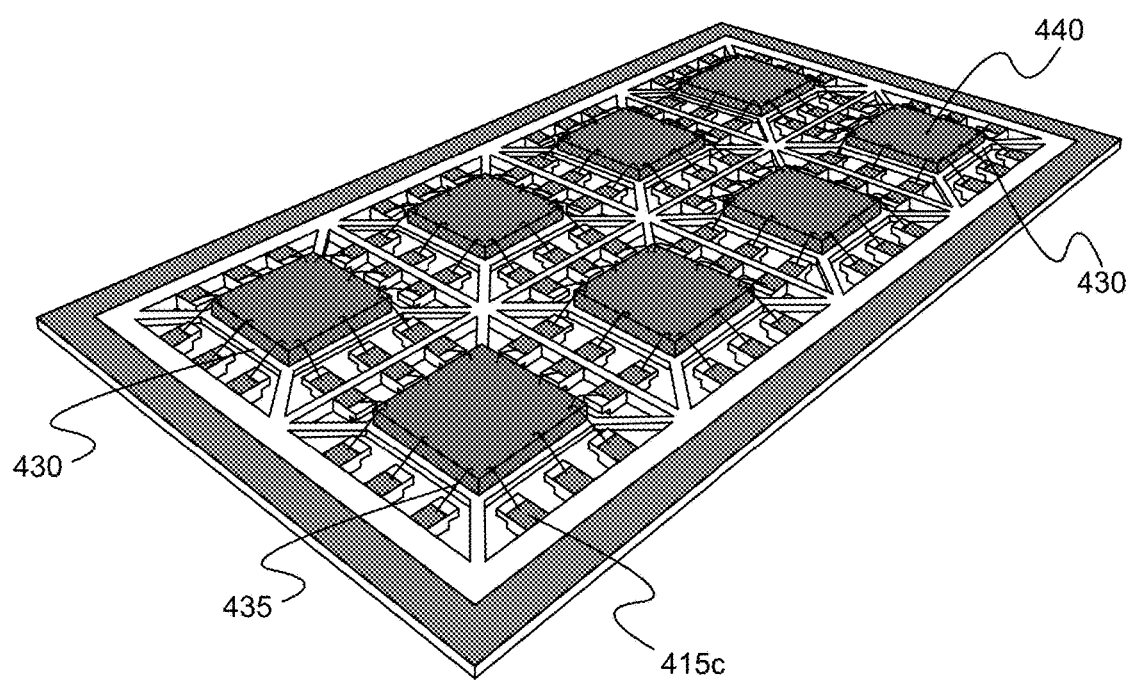

At a Step 315, a plurality of semiconductor dice 440 is electrically coupled with the plurality of contacts. Each device area 415 includes at least one semiconductor die 440. In some embodiments, as illustrated in FIG. 4C, on the front side of the leadframe strip 400, epoxy is applied between the die attach pads 430 and the semiconductor dice 440, and wirebonds couple the semiconductor dice 440 with the area 415c of the second portions 415 of the contacts 415. Alternatively, on the front side of the leadframe strip 400, the semiconductor dice 440 are flipped and positioned so that solder balls couple the semiconductor dice 440 with the area 415c of the second portions 415 of the contacts 415.

Figure 4D:
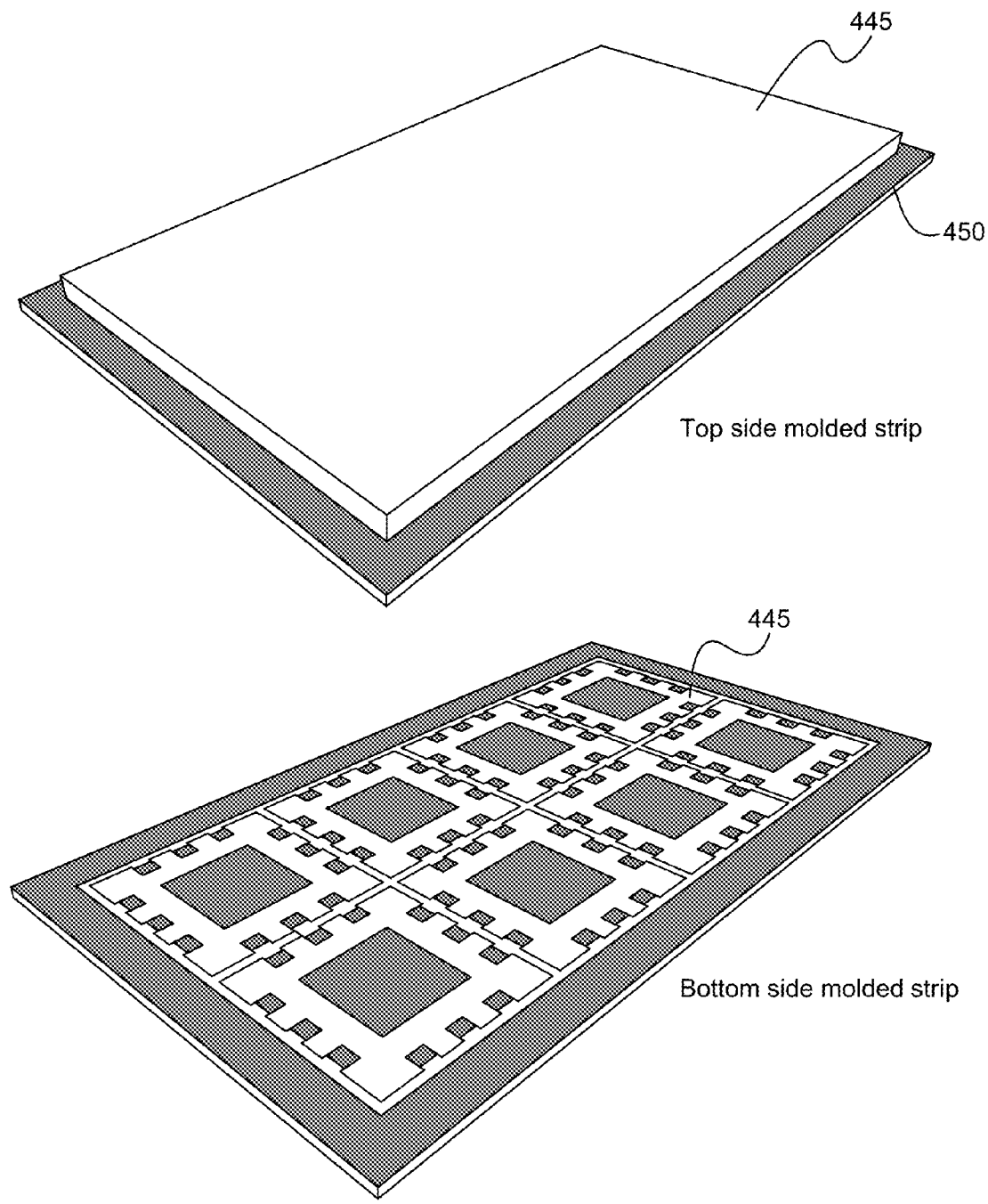

At a Step 320, the plurality of semiconductor dice 440 is encapsulated with a molding compound 445, resulting in a molded leadframe strip 450. FIG. 4D illustrates the top side of the molded leadframe strip 450 and the bottom side of the molded leadframe strip 450.

Figure 4E:
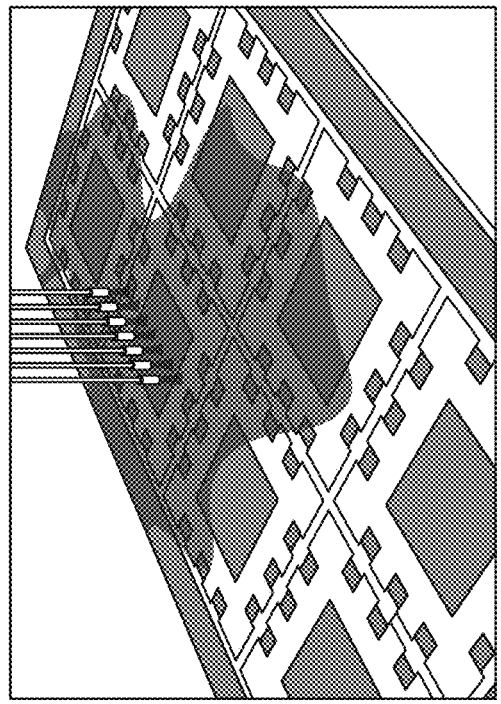
Figure 4E:
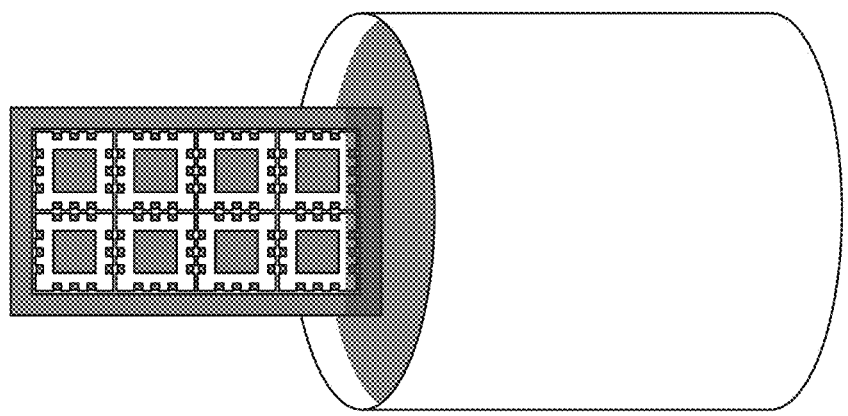
Figure 4F:
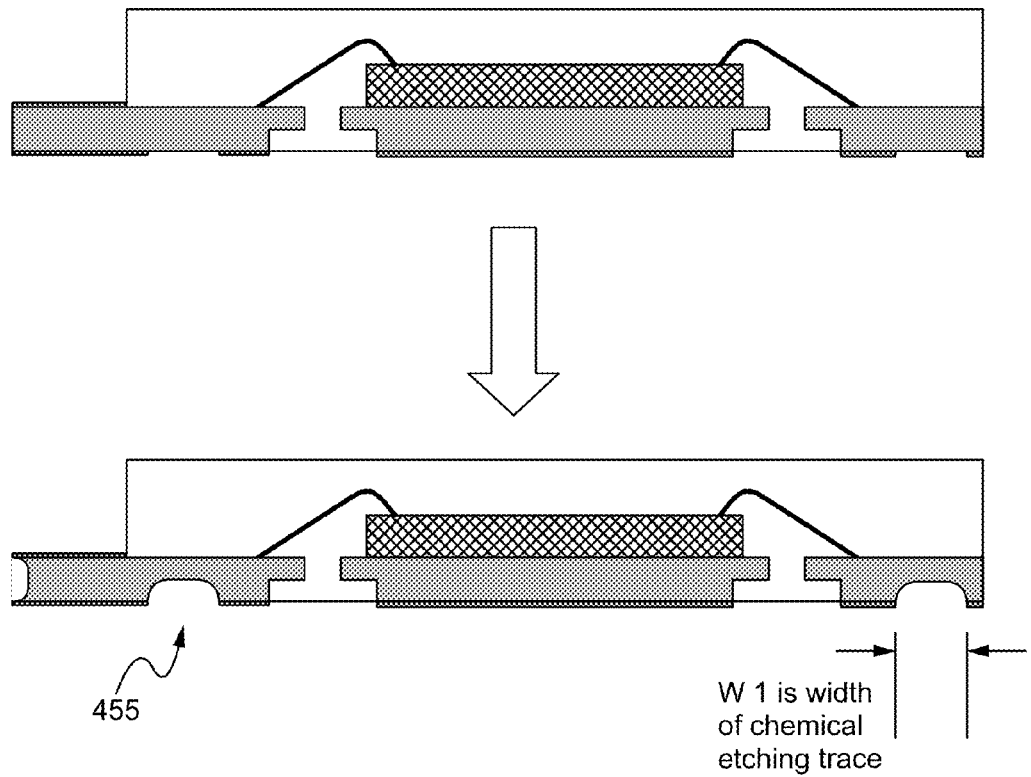

At a Step 325, at least a portion of the molded leadframe strip 450 is removed, thereby creating etching traces 455. A chemical etching process, such as a copper chemical etching dip process or a copper chemical etching spray process of FIG. 4E, is applied to remove exposed copper portions of the molded leadframe strip 450 that were not plated at the Step 310. The degree of etching is not a full etch/cut. Instead, in some embodiments, the degree of etching is a half etch (e.g., etch to half the thickness of the leadframe strip 400). More or less etching is contemplated, depending on application. It is important not to fully etch in order for it to carry electricity in a later electric plating step (e.g., Step 335). The chemical etching process creates the chemical etching traces 455 along the unplated areas at the bottom of the molded leadframe strip 450. FIG. 4F illustrates a cross sectional view of the molded leadframe strip 450 before the Step 325 and a cross sectional view of the molded leadframe strip 450 after the Step 325. The chemical etching traces 455 are shown in the cross sectional view of the molded leadframe strip 450. In some embodiments, the corners of the chemical etching traces 455 are curved.

Figure 4G:
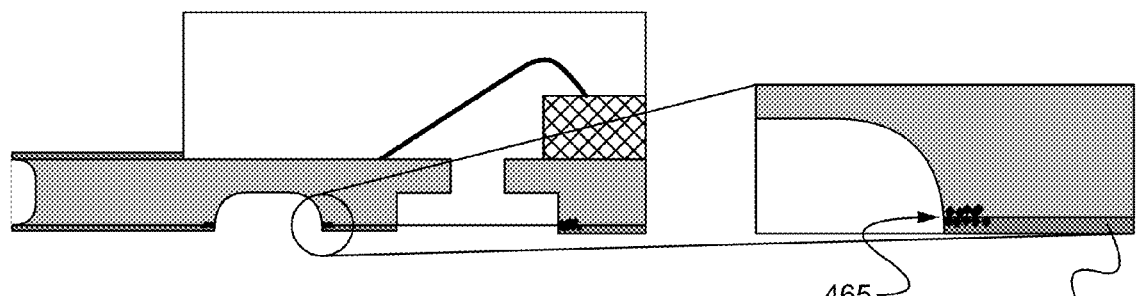
Figure 4H:
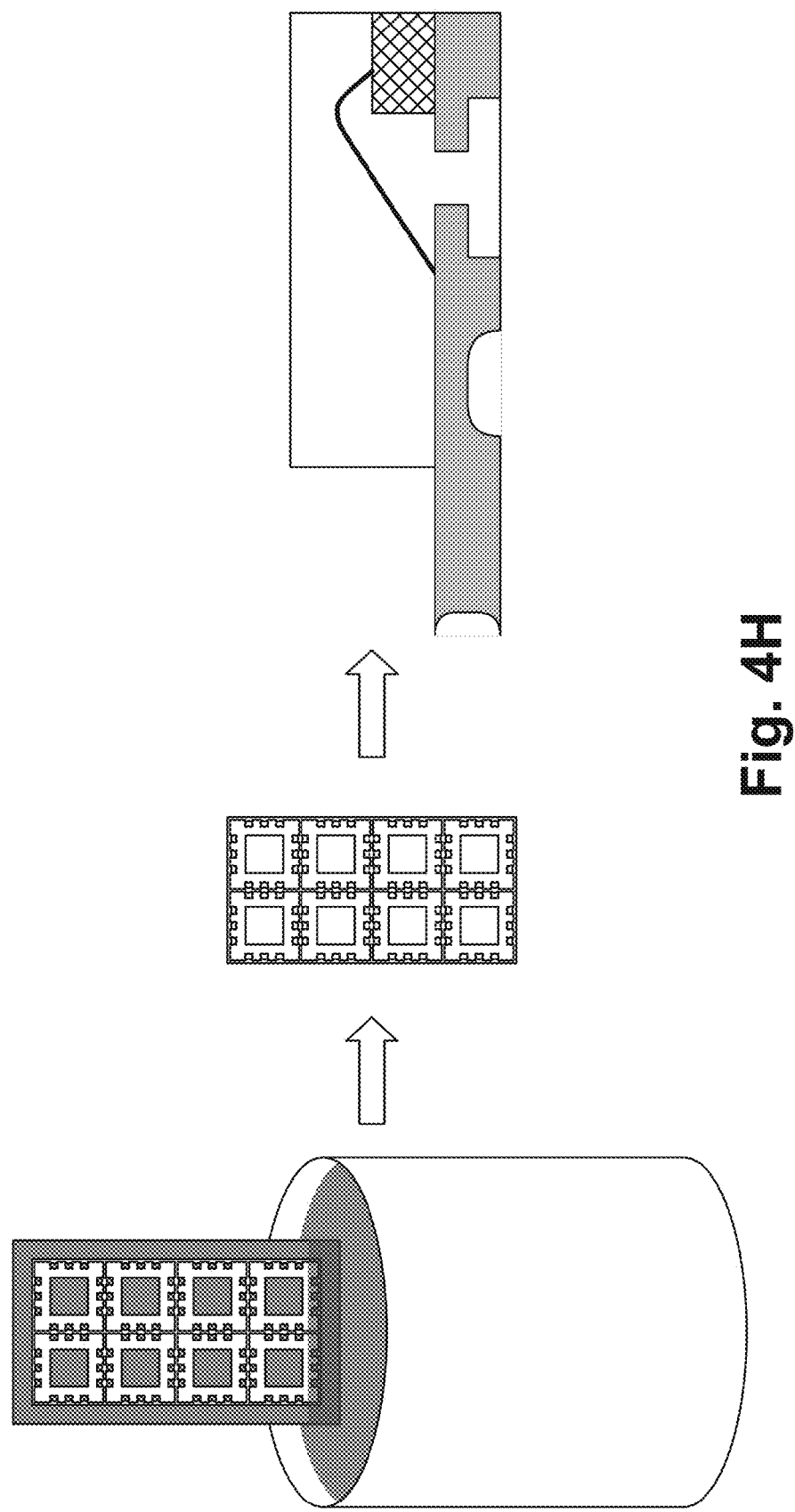

The chemical etching process can result in one or more "weak points" 465 between the metal plating 460 and the copper base material of the molded leadframe strip 450, as illustrated in FIG. 4G. To avoid the isotropic etching effect, at a Step 330, the metal plating 460 of the molded leadframe strip 450 are removed via, for example, a dip process, as illustrated in FIG. 4H to reveal exposed areas of the molded leadframe 450. Other strip off procedures are contemplated.

Figure 4I:
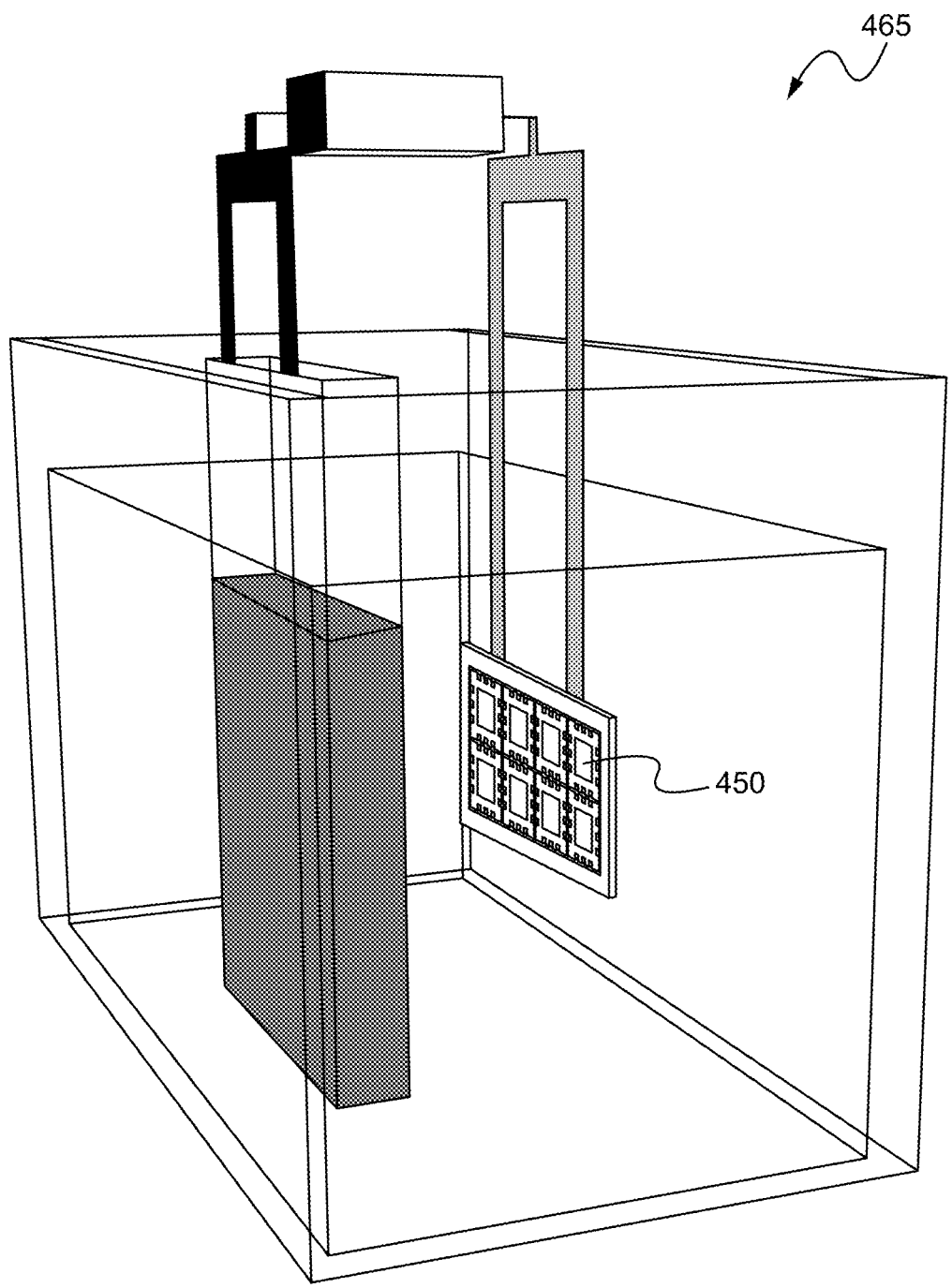
Figure 4J:
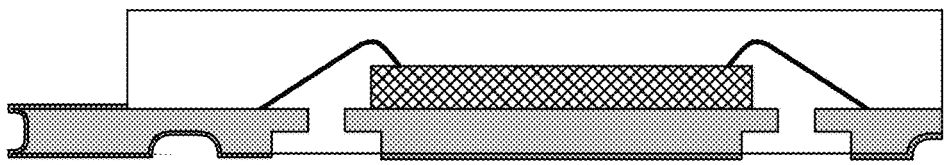

At a Step 335, the exposed areas of the molded leadframe strip 450 are plated. Particularly, the molded leadframe strip 450 is plated with a plating material can be Sn or other suitable material on the exposed copper, including the chemical etching traces 455, of the molded leadframe 450 in order to prevent surface reaction with oxygen. In some embodiments, an electric plating process is used. FIG. 4I illustrates an exemplary electric plating machine 465. The molded leadframe 450 is held at a cathode terminal of the electric plating machine 465, while the plating material is located in a basket at an anode terminal. Both the molded leadframe 450 and the plating material are immersed in a plating solution that is in a plating tank. When an electrical power source is operating in the plating tank, an electrical current brings particles of the plating material from the anode terminal to the cathode terminal via the plating solution. Because the molded leadframe 450 is held at the cathode terminal, the plating particles which come along with the electrical current are plated on the metal surfaces of the molded leadframe 450. FIG. 4J illustrates a cross sectional view of the molded leadframe 450 after the Step 335. The new plating material is plated on the exposed copper, including the chemical etching traces 455, of the molded leadframe 450.

Figure 4K:
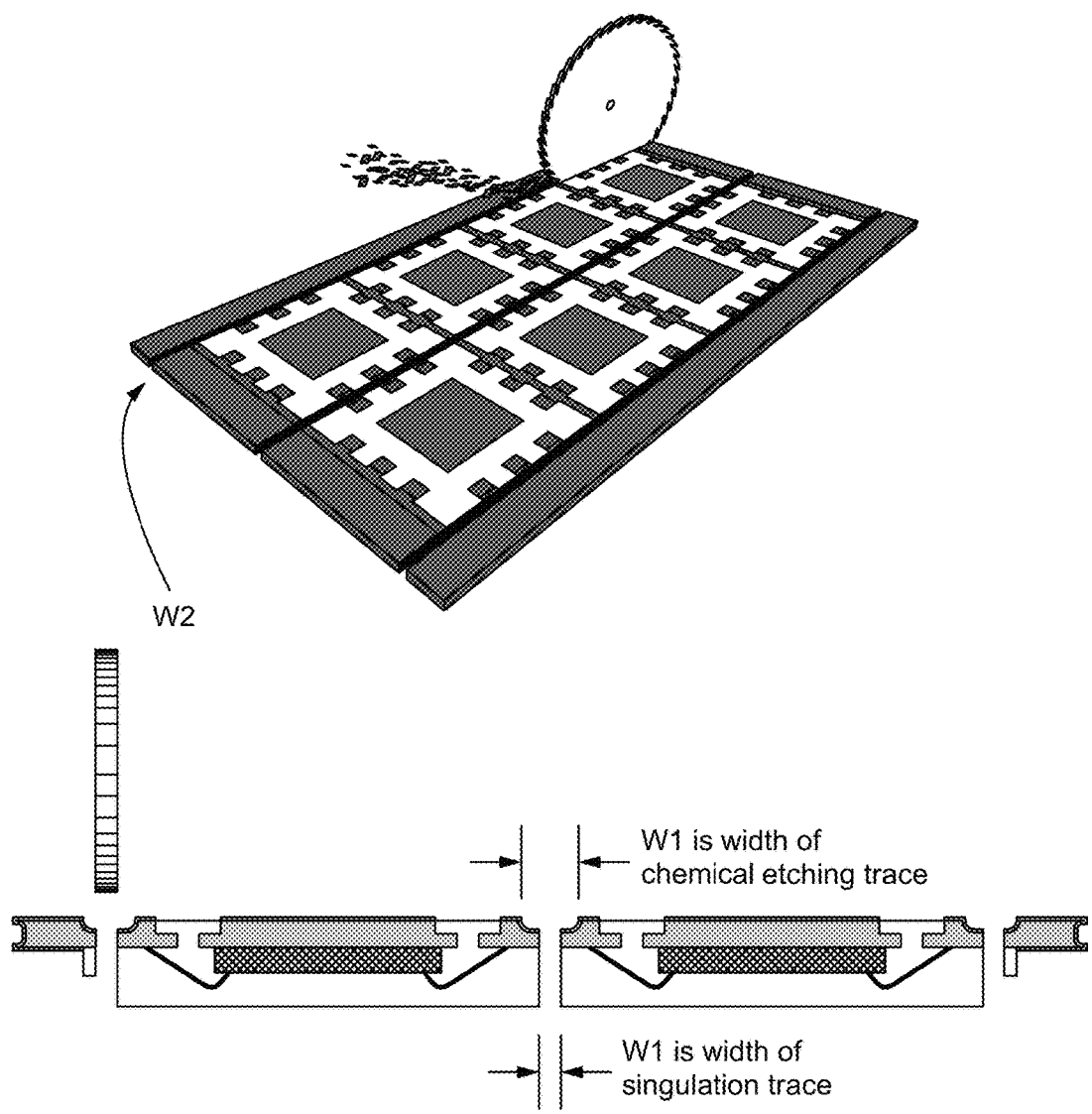

At a Step 340, each of the semiconductor packages is singulated, along singulation traces, from other semiconductor packages. In some embodiments, the singulation uses a saw or blade, as illustrated in FIG. 4K. The thickness of the blade is narrower than the width of the chemical etching traces 455. In some embodiments, the molded leadframe 450 is singulated at the center location of the chemical etching traces 455. As such, the width of each of the singulation traces is less than the width of each of the etching traces. The method 300 results in singulated semiconductor packages.

Figure 5A:
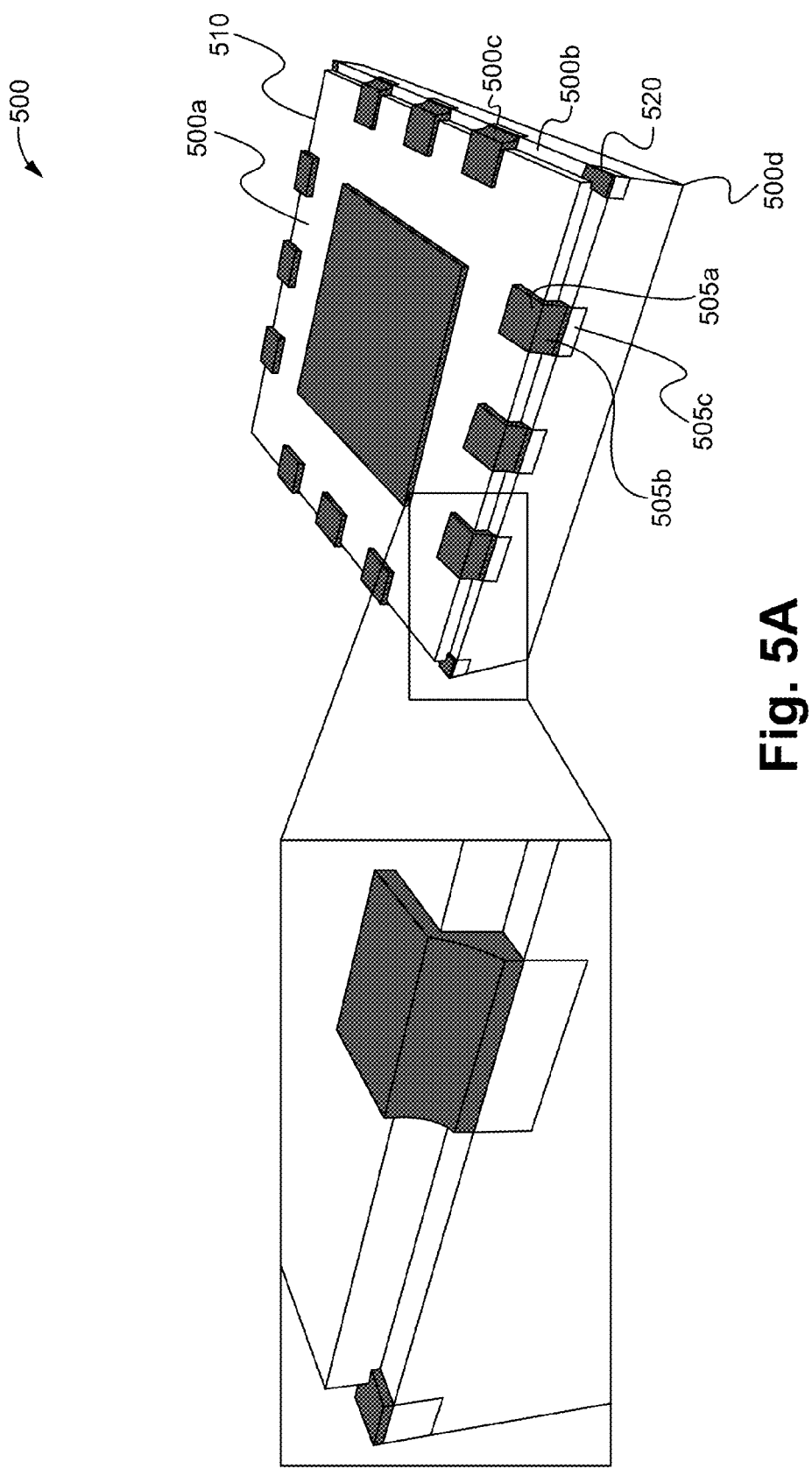
FIGS. 5A-5B illustrate a singulated semiconductor package according to some embodiments.
Figure 5B:
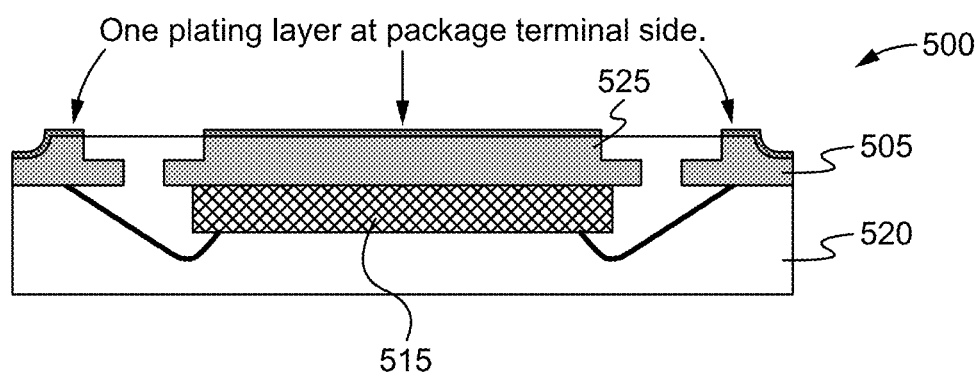
Figure 6:
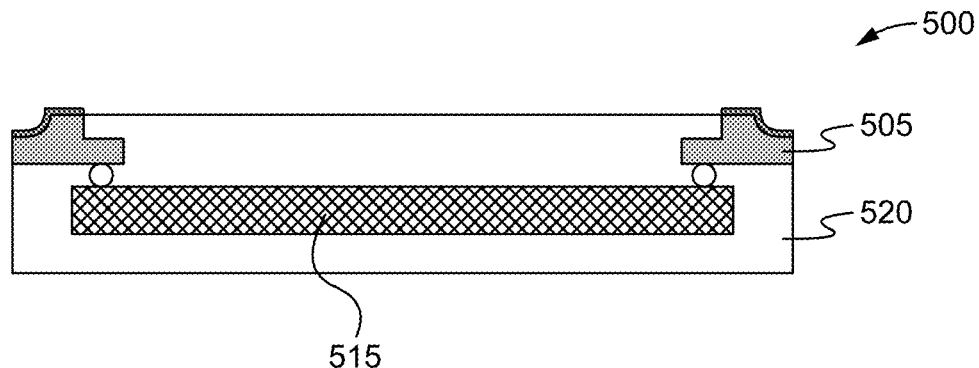
FIG. 6 illustrates another singulated semiconductor package according to some embodiments.

FIGS. 5A-5B illustrate a singulated semiconductor package 500 according to some embodiments. In particular, FIG. 5A illustrates a perspective view of the singulated semiconductor package 500 and FIG. 5B illustrates a cross sectional view of the singulated semiconductor package 500. After singulation, the semiconductor package 500 includes a formed leadframe that includes a plurality of contacts 505. The plurality of contacts 505 is located around peripheral edges 510 of the singulated semiconductor package 500. Side surfaces of each of the plurality of contacts 505 are partially plated. A semiconductor die 515 is electrically coupled with the plurality of contacts 505. In some embodiments, the formed leadframe also includes tie bars and a die attach pad 525 that is coupled with the tie bars. In FIG. 5B, the semiconductor die 515 is epoxied with the die attach pad 525 and is electrically coupled with the plurality of contacts 505 using wirebonds. Alternatively, instead of wirebonds, solder balls are used to electrically couple the semiconductor die with the plurality of contacts, as illustrated in FIG. 6. Although a single semiconductor die 515 is described, it is contemplated that a singulated semiconductor device can include a plurality of semiconductor dice stacked therein and electrically coupled with each other and/or the plurality of contacts 505. Each of the plurality of contacts 505 includes an interfacing surface at a bottom of the singulated semiconductor package 500, an interior surface that is opposite the interfacing surface, a step at a non-exposed end that is positioned near the semiconductor die 515 and a curved corner at an exposed end (e.g., side surface) that is opposite the non-exposed end, such that the area of the exposed surface of the contact 505 is smaller than the area of the interior surface of the contact 505.

Referring back to FIGS. 5A-5B, the singulated semiconductor package 500 includes a molding compound 520 that encapsulates the semiconductor die 515. The molding compound 520 also encapsulates at least a portion of the die attach pad 525 such that the die attach pad 525 is exposed and flush with a bottom surface 500a of the semiconductor package 500. The molding compound 520 further encapsulates at least a portion of each of the plurality of contacts 505 such that a first surface 505a of a corresponding contact 505 is flush with the bottom surface 500a of the semiconductor package 500, a second surface 505c of the corresponding contact 505 is flush with a side surface 500c of the semiconductor package 500, and a curved surface 505b of the corresponding contact 505 is located at a step 500b of the side surface 500c of the semiconductor package 500. The die attach pad 525 exposed at the bottom surface 500a of the semiconductor package 500, and the first surfaces 505a and the curved surfaces 505b of the plurality of contacts 505 are plated via a single plating step (the Step 335 of FIG. 3). However, the second surfaces 505c of the plurality of contacts 505 are not plated. In particular, as the result of singulation (the Step 340 of FIG. 3), the second surfaces 505c (the "upright" surfaces) of the plurality of contacts 505 are exposed copper at the sides 500c of the semiconductor package 500. Each side (the curved surface 505b and the second surface 505c, collectively) of the plurality of contacts 505 is thus partially plated.

The curved surfaces 505b of the plurality of contacts 505 are concave, as the result of the Steps 325-335 of FIG. 3 (e.g., copper chemical etching to Sn plating steps). In some embodiments, because the degree of etching at the Step 325 of FIG. 3 is a half etch, the height of the curved surfaces 505b is half the height of the contacts 505. As explained elsewhere, a step portion of the molding compound 520 (the step 500b of the semiconductor package along/on one edge/side of the semiconductor package) will assist in the visual inspection for proper solder coverage on the sides of the plurality of contacts 505 when the semiconductor package 500 is reflowed on a PCB. Because of the step portion of the molding compound 520, the area of the bottom surface 500a of the semiconductor package 500 is smaller than the area of a top surface 500d of the semiconductor package 500.

Figure 7A:
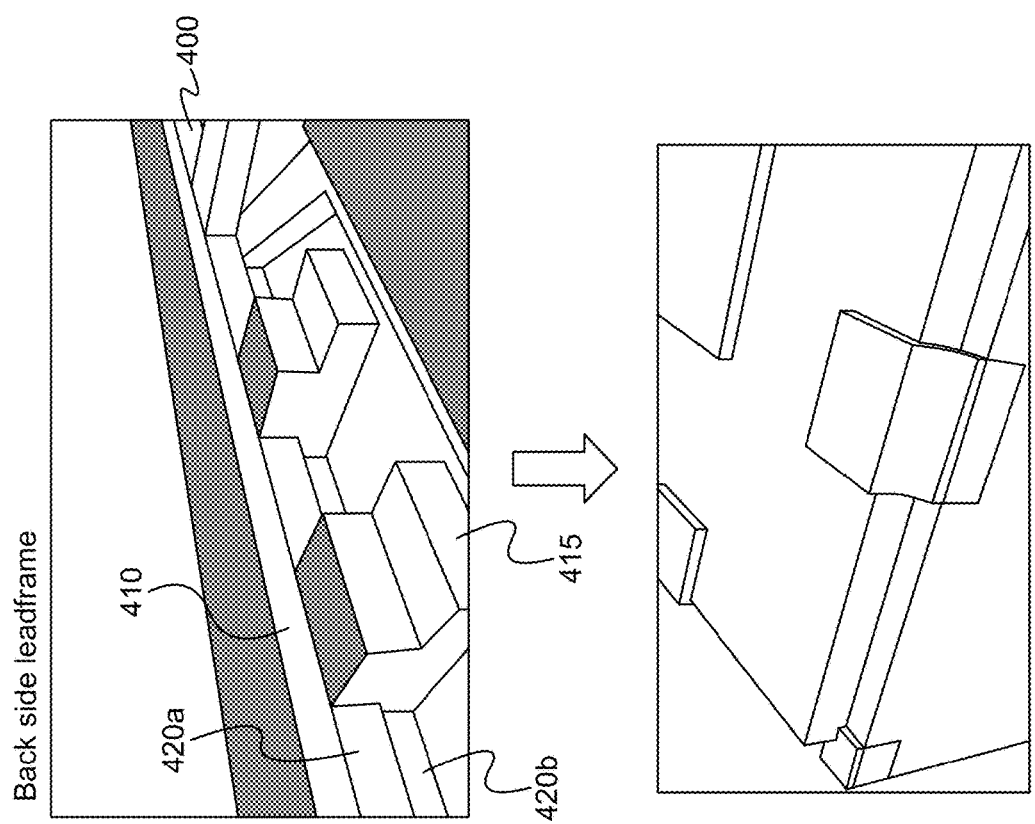
FIG. 7A illustrates a graphical explanation of how a step portion of a molding compound is shaped according to some embodiments

FIG. 7A illustrates a graphical explanation of how a step portion of a molding compound is shaped according to some embodiments. In FIG. 7A, the step portion of the molding compound continuously runs the full package length. As discussed above, regarding FIG. 4B, each dam bar 410 includes the step 420 that is formed by the extruding portion 420a and the non-extruding portion 420b. The step 420 continuously runs the full length of a corresponding dam bar 410. The step 420 of the leadframe strip 400 shapes the step portion of the molding compound. The unplated step 420 of the leadframe strip 400 is removed during the copper chemical etching process (the Step 325 of FIG. 3), which results in the step portion of the molding compound being "full."

FIG. 7B illustrates a graphical explanation of how an alternate step portion of a molding compound is shaped according to some embodiments. In FIG. 7B, the step portion of the molding compound discretely runs the full package length at locations of the plurality of contacts. Each dam bar 410' includes a step 420' that is formed by an extruding portion 420a' and a non-extruding portion 420b. The step 420' discretely runs the full length of a corresponding dam bar 410' such that there are gaps 700 in the step 420' between the plurality of contacts 415. The step 420' of the leadframe strip 400' shapes the step portion of the molding compound. The unplated step 420' of the leadframe strip 400' is removed during the copper chemical etching process (the Step 325 of FIG. 3), which results in the step portion of the molding compound being "partial," with a part of the step portion at each of the plurality of contacts 415.

Figure 8:
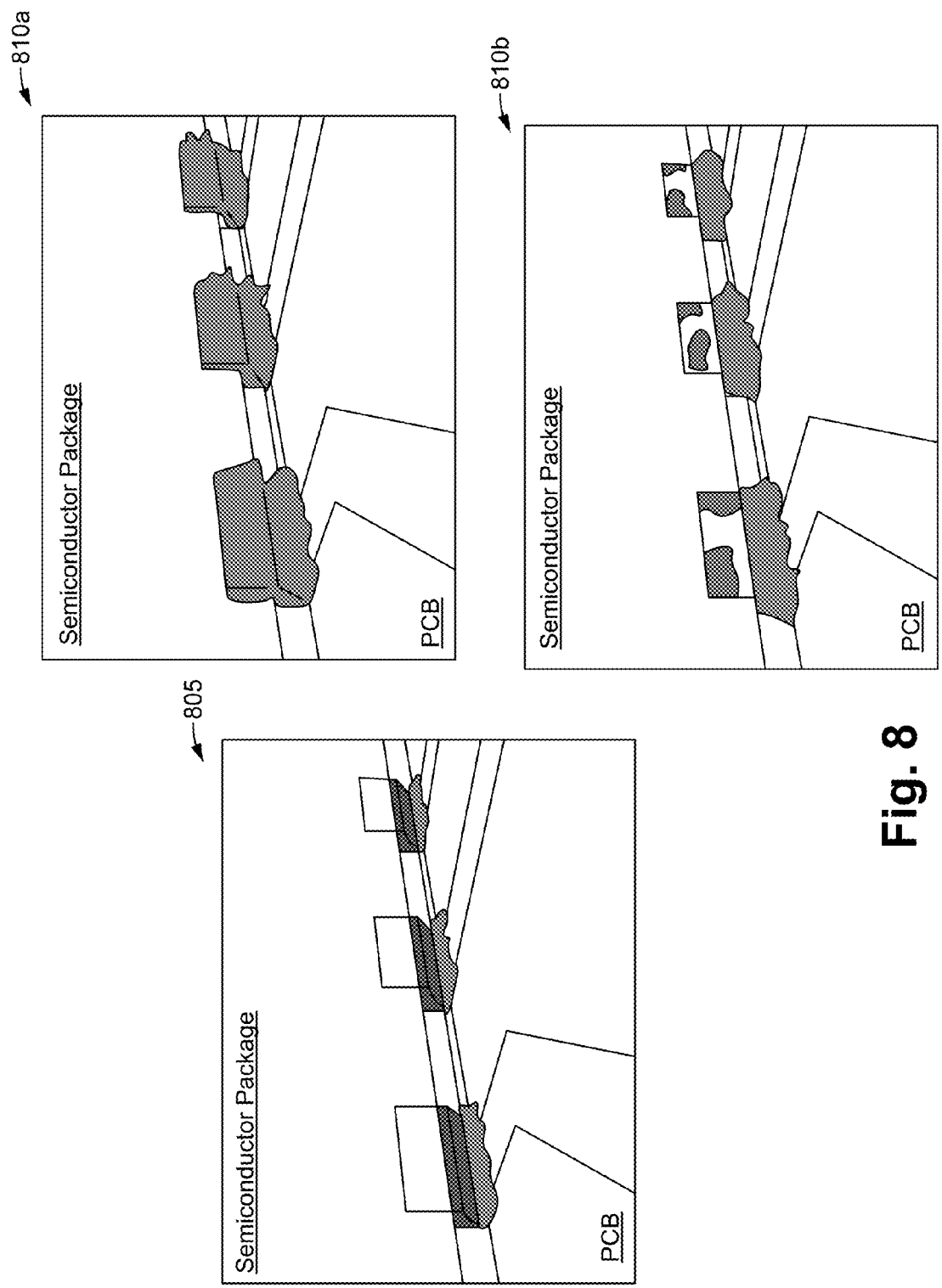
FIG. 8 illustrates a graphical explanation of an application according to some embodiments.

FIG. 8 illustrates a graphical explanation of an application according to some embodiments. The picture 805 on the left shows a semiconductor package, such as the semiconductor package 500, on a PCB before reflow. Solder is applied between the plurality of contacts and PCB. After reflow, one of two results can happen. One result, shown in the picture 810a on the top right, if the exposed copper surfaces of the plurality of contacts are not contaminated, the solder can cover the entire side surfaces of the plurality of contacts during soldering. Another result, shown in the picture 810b on the bottom right, if the copper surfaces of the plurality of contacts are contaminated, the solder can still partially cover the side surfaces of the plurality of contacts, particularly the areas of the side surfaces that are plated, during soldering. In both of these results, reliability of solder joint is good and can be determined as such by visual inspection.

Mechanical Sawing to Half Cut Leadframe

In some embodiments, a mechanical saw is used on one side of a leadframe to half saw the leadframe and, then, another mechanical saw is used on the other side of the leadframe to half cut the leadframe, thereby singulating semiconductor packages from each other. In some embodiments, the second mechanical sawing results in the third surface of each contact being L-shaped.

Figure 9:
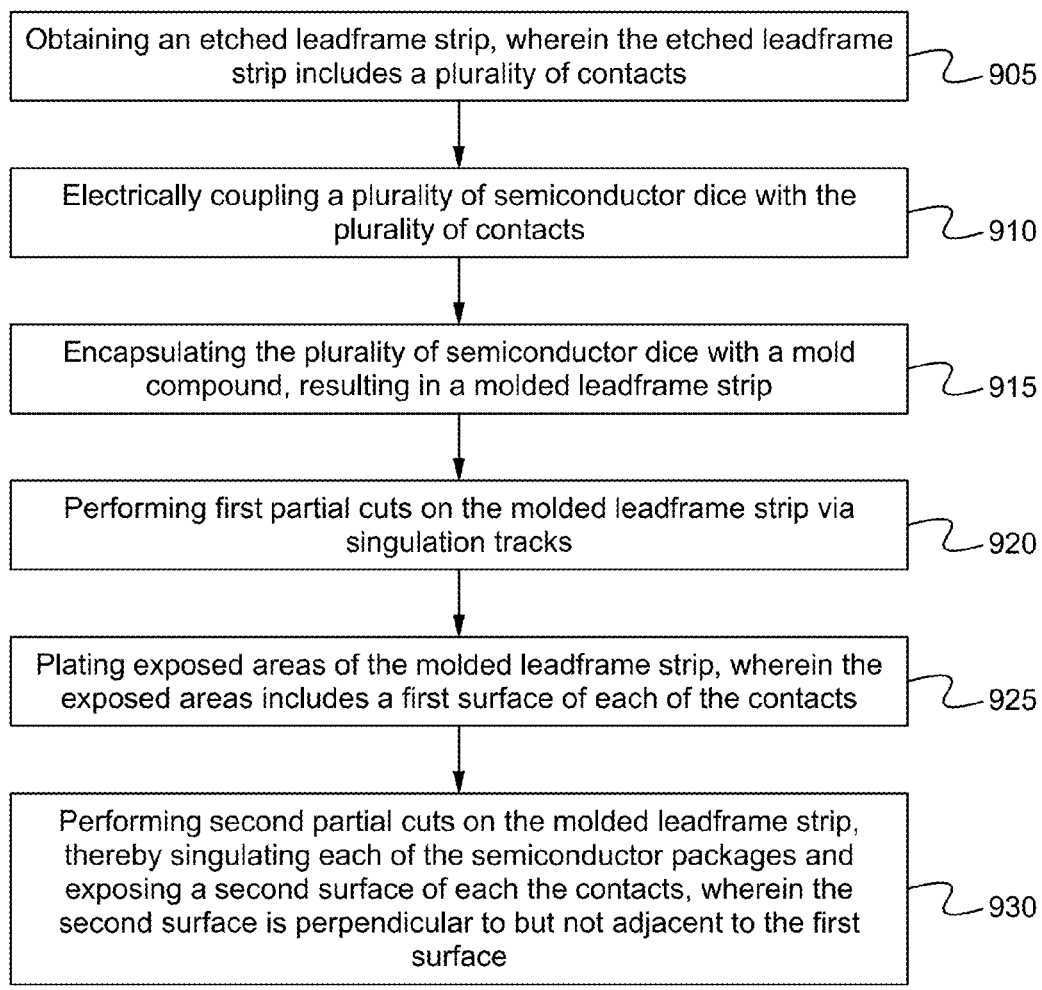
FIG. 9 illustrates another exemplary method of manufacturing semiconductor packages according to some embodiments.
Figure 10A:
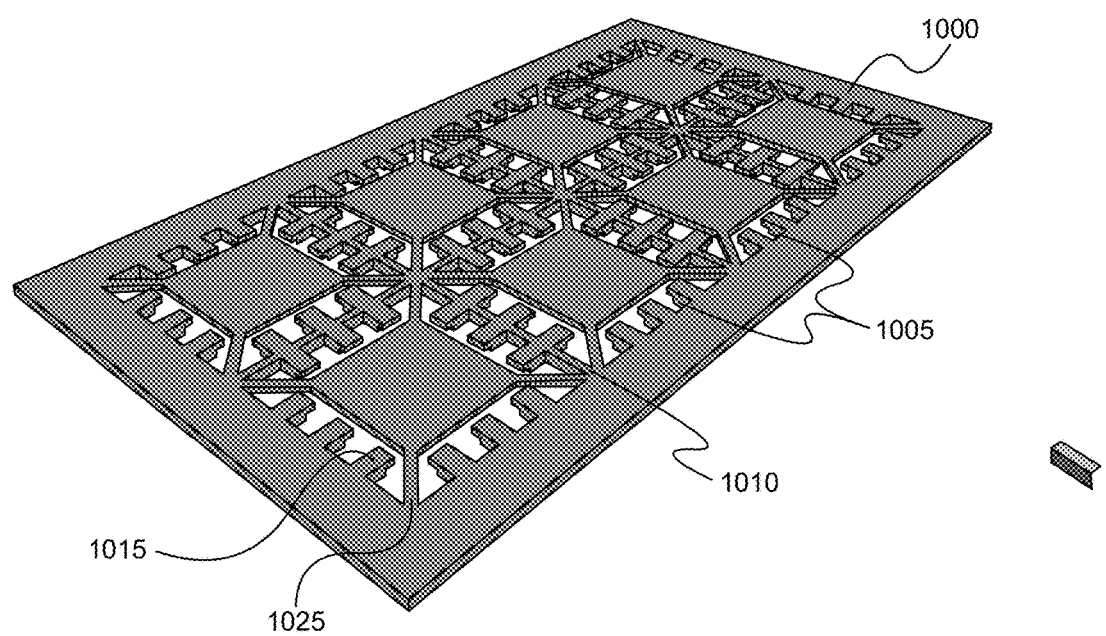
FIGS. 10A-10D illustrate an exemplary result produced at each step of the method of FIG. 9.

FIG. 9 illustrates another exemplary method of manufacturing semiconductor packages according to some embodiments. An exemplary result produced by each step of the method 900 is illustrated in FIGS. 10A-10D. The method 900 begins at a Step 905, where an etched leadframe strip 1000 is obtained. In some embodiments, the etched leadframe strip 1000 is made of copper. FIG. 10A illustrates the front side (or top side) of the leadframe strip 1000. In some embodiments, the leadframe strip 1000 is similarly configured as the leadframe strip 400. The leadframe strip 1000 includes an array of device areas 1005. Although the leadframe strip 1000 is shown to include a 3×2 array of device areas 1005, the array of device areas can be bigger or smaller.

Each device area 1005 includes dam bars 1010 and contacts 1015 coupled with the dam bars 1010. The dam bars 1010 enclose a corresponding device area 1005. In some embodiments, the corresponding device area 1005 further includes tie bars 1025 and a die attach pad 1030 coupled with the tie bars 1025 such that the die attach pad 1030 is suspended to the leadframe strip 1000 in the corresponding device area 1005 via the tie bars 1025.

Figure 10B:
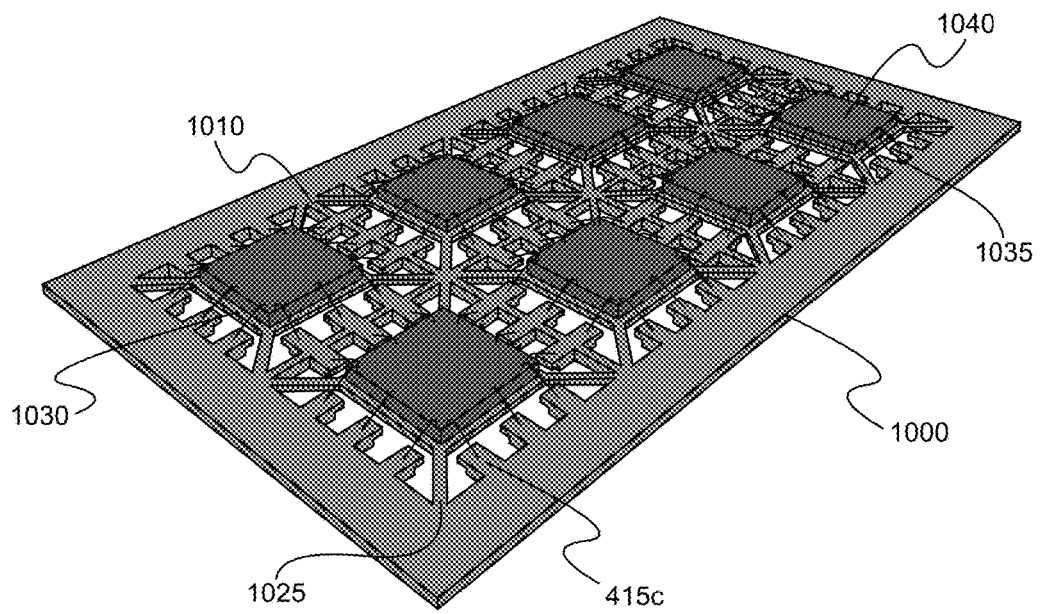

At a Step 910, a plurality of semiconductor dice 1040 is electrically coupled with the plurality of contacts 1015. Each device area 1005 includes at least one semiconductor die 1040. In some embodiments, as illustrated in FIG. 10B, on the front side of the leadframe strip 1000, epoxy is applied between the die attach pads 1030 and the semiconductor dice 1040, and wirebonds couple the semiconductor dice 1040 with the contacts 1015. Alternatively, on the front side of the leadframe strip 1000, the semiconductor dice 1040 are flipped and positioned so that solder balls couple the semiconductor dice 1040 with the contacts 415.

Figure 10C:
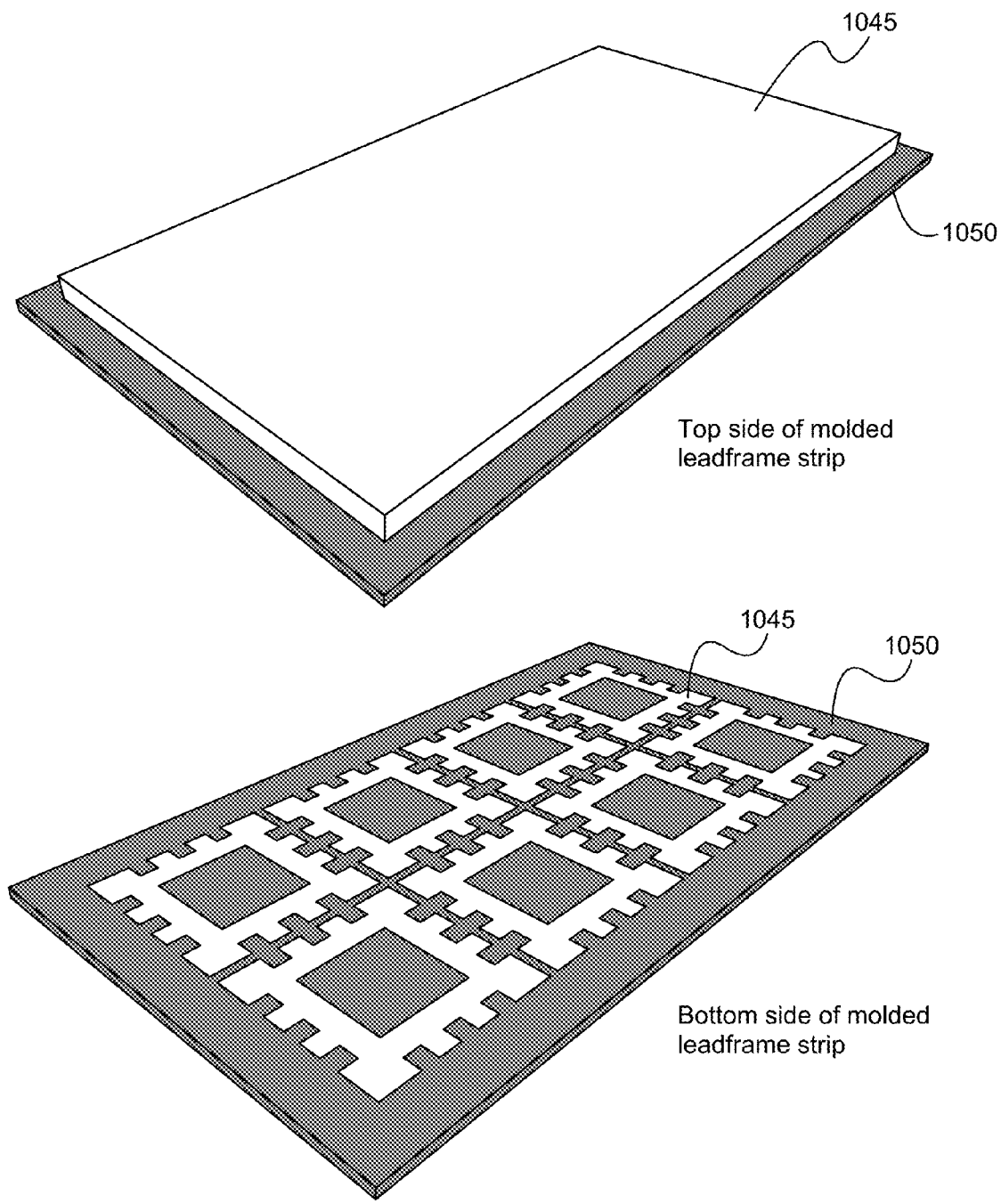
Figure 10D:
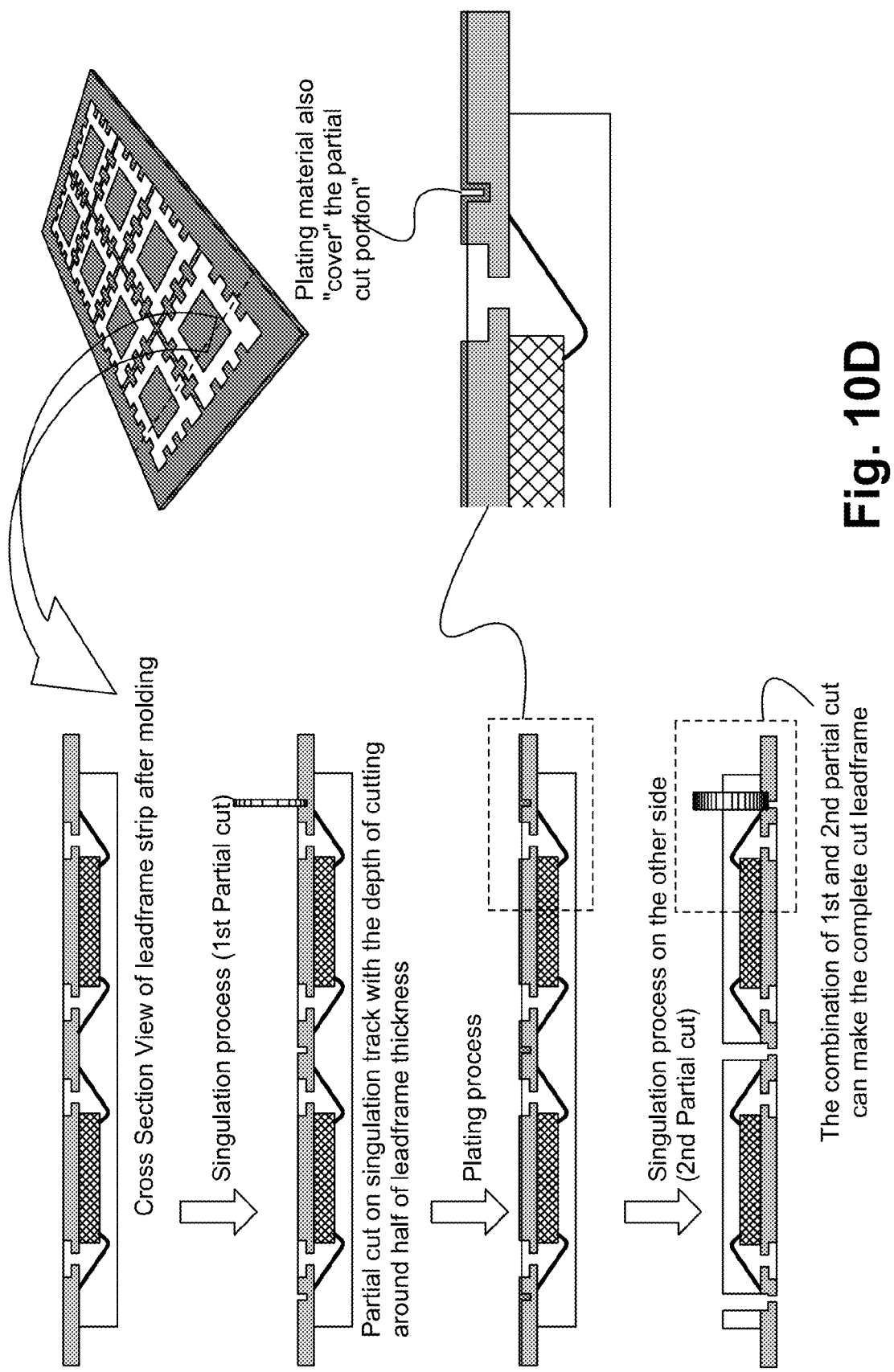

At a Step 915, the plurality of semiconductor dice 1040 is encapsulated with a molding compound 1045, resulting in a molded leadframe strip 1050. FIG. 10C illustrates the top side of the molded leadframe strip 1050 and the bottom side of the molded leadframe strip 1050. At this step, the molded leadframe strip 1050 includes one copper sheet, in which the entire sheet is able to conduct electric current.

At a Step 920, first partial cuts on the molded leadframe strip 1050 via singulation tracks are performed on a backside of the molded leadframe strip 1050. In some embodiments, the singulation tracks are along the dam bars 1010 (located at a bottom of the molded leadframe 1050). In some embodiments, the singulation tracks can be as wide as the dam bars. In some embodiments, the degree of the first partial cuts is a half cut (e.g., cut to half the thickness of the leadframe strip 1000).

At a Step 925, exposed areas of the molded leadframe strip 1050 are plated. Particularly, the molded leadframe strip 1050 is plated with a plating material, which can be Sn or other suitable material on the exposed copper, including the partial cut portions, of the molded leadframe 1050 in order to prevent surface reaction with oxygen. The exposed areas can include, but not limited to, grooves (e.g., cut portions from the first partial cuts), die attach pad surfaces and contact surfaces (e.g., first surface of each of the contacts) that are located at the bottom of the molded leadframe strip 1050. In some embodiments, an electric plating process is used. For example, the electric plating machine 465 of FIG. 4I can be utilized.

At a Step 930, second partial cuts on the molded leadframe strip 1050 are performed on a front side of the molded leadframe strip 1050, thereby singulating each of the semiconductor packages and exposing a second surface of each of the contacts. The second surface is perpendicular to but not adjacent to the first surface. In some embodiments, the degree of the second partial cuts is through the molding compound to the other side of the leadframe and a half cut (e.g., cut to half the thickness of the leadframe strip 1000) to make complete cuts of the leadframe strip 1000.

Figure 11A:
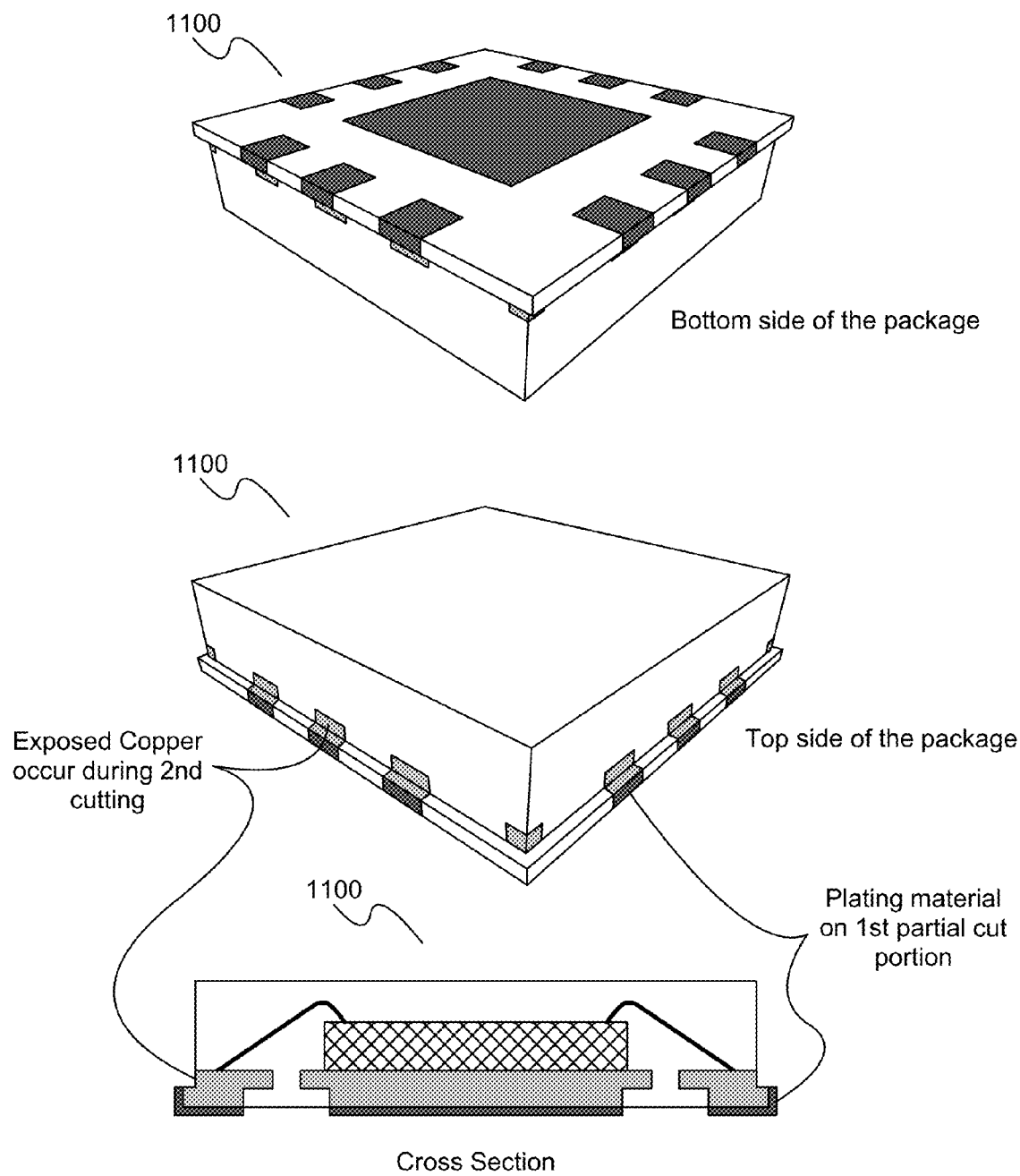
FIGS. 11A-12C illustrate other exemplary singulated semiconductor packages according to some embodiments.

In some embodiments, the blade used in the Step 930 is thicker than the blade used in the Step 920. FIG. 11A illustrates different views of an exemplary singulated semiconductor device 1100 when the thicker blade is used in the Step 930 than in the Step 920. In particular, a bottom side, a top side and a cross section of the semiconductor device 1100 are shown in FIG. 11A. During singulation (the Step 930), a step is created at each side of the semiconductor device 1100 because the blades used at the Step 920 and the Step 930 have different thicknesses. The step runs the full length of each side of the semiconductor device 1100. The area of the bottom surface of the singulated semiconductor device 1100 is greater than the area of the top surface of the singulated semiconductor device 1100. During singulation (the Step 930), a third surface of each of the contacts is also created. From the top perspective of the singulated semiconductor device 1100, the third surface is an outwardly-shaped "L" and is located at a step and includes a first portion and a second portion. The first portion of the third surface is perpendicular to and outwardly extends from the second surface, and the second portion of the third surface is perpendicular to and extends from the first portion of the third surface to the first surface. The first portion of the third surface is parallel with the first surface, while the second portion of the third surface is parallel with but is offset from the second surface. The first surface and the second portion of the third surface are plated at the same time at the Step 925. In other words, a continuous plating layer is directly adhered to the first surface and the second portion of the third surface. The second surface and the first portion of the third surface are not plated as they are exposed by the Step 930.

Figure 11B:
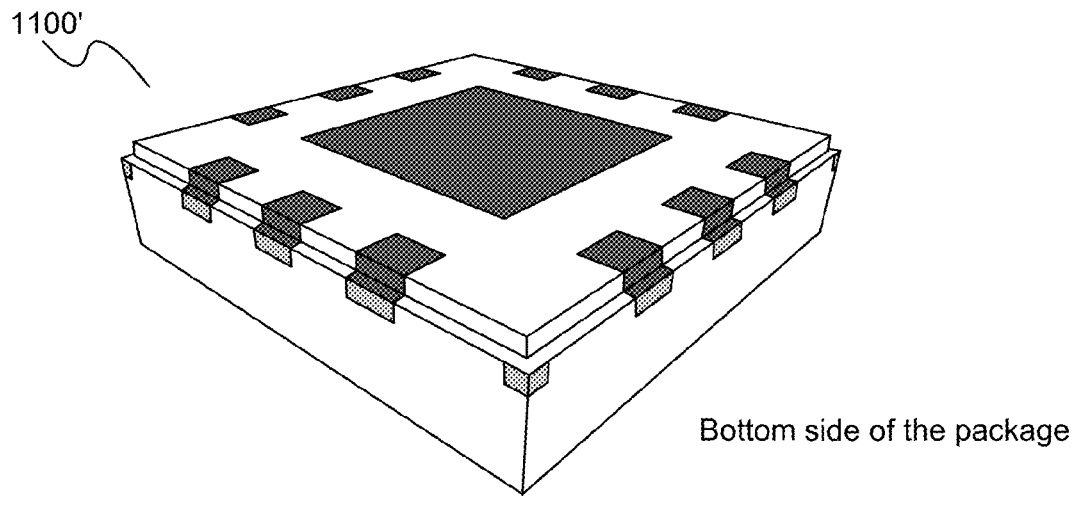
Figure 11B:
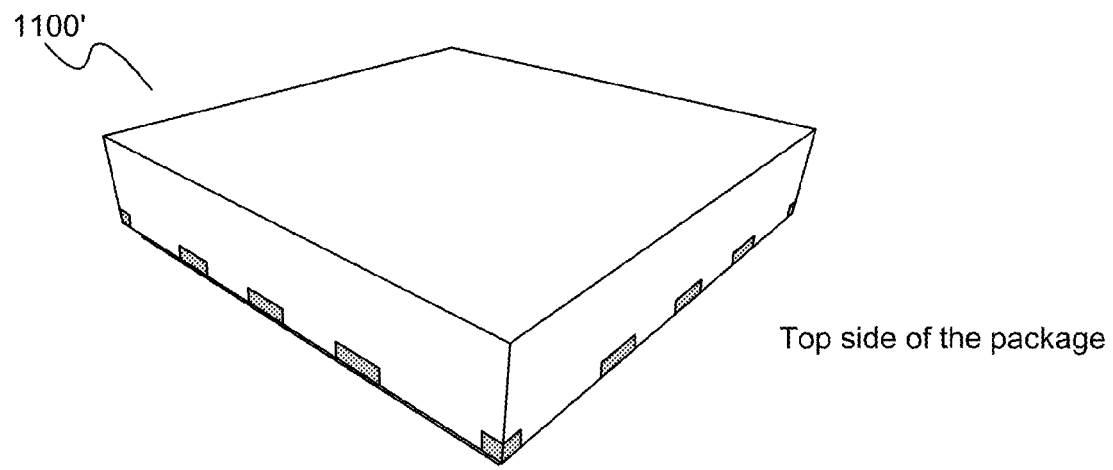
Figure 11B:
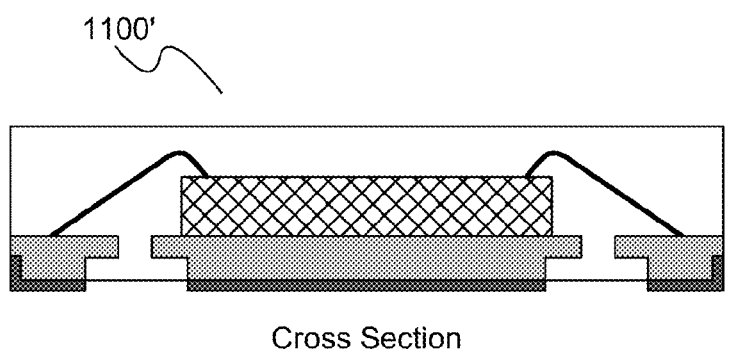

Alternatively, the blade used in the Step 930 is thinner than the blade used in the Step 920. FIG. 11B illustrates different views of an exemplary singulated semiconductor device 1100' when the thinner blade is used in the Step 930 than in the Step 920. In particular, a bottom side, a top side and a cross section of the semiconductor device 1100' are shown in FIG. 11B. During singulation (the Step 930), a step is created at each side of the semiconductor device 1100' because the blades used at the Step 920 and the Step 930 have different thicknesses. The step runs the full length of each side of the semiconductor device 1100'. The area of the top surface of the singulated semiconductor device 1100' is greater than the area of the bottom surface of the singulated semiconductor device 1100'. During singulation (the Step 930), a third surface of each of the contacts is also created. From the top perspective of the singulated semiconductor device 1100', the third surface is an inwardly-shaped "L" and is located at a step and includes a first portion and a second portion. The first portion of the third surface is perpendicular to and inwardly extends from the second surface, and the second portion of the third surface is perpendicular to and extends from the first portion of the third surface to the first surface. The first portion of the third surface is parallel with the first surface, while the second portion of the third surface is parallel with but is offset from the second surface. All of the first surface and all of the third surface (e.g., the first and second portions of the third surface) are plated at the same time at the Step 925. In other words, a continuous plating layer is directly adhered to all of the first surface and all of the third surface. The second surface is not plated as it is exposed by the Step 930.

Figure 11C:
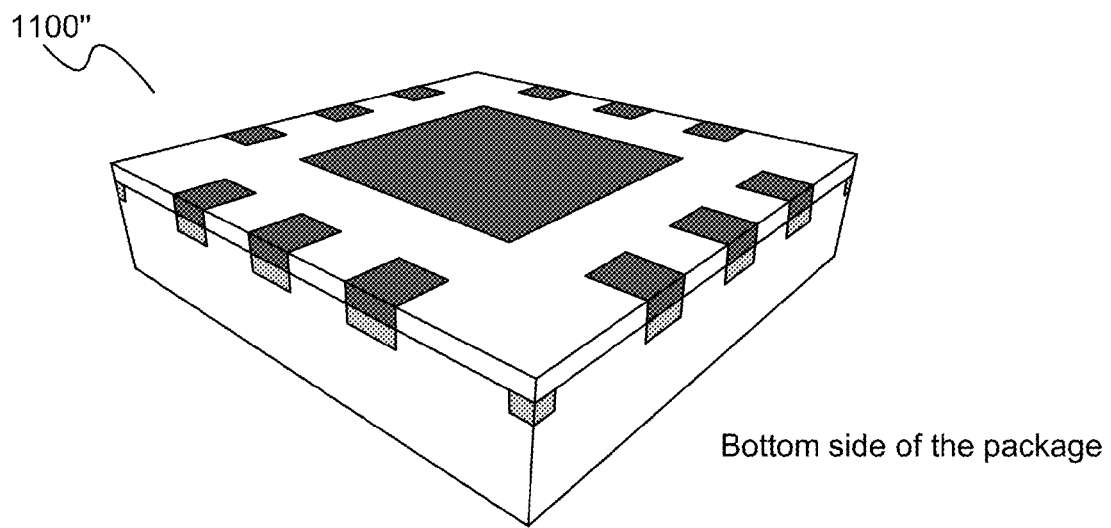
Figure 11C:
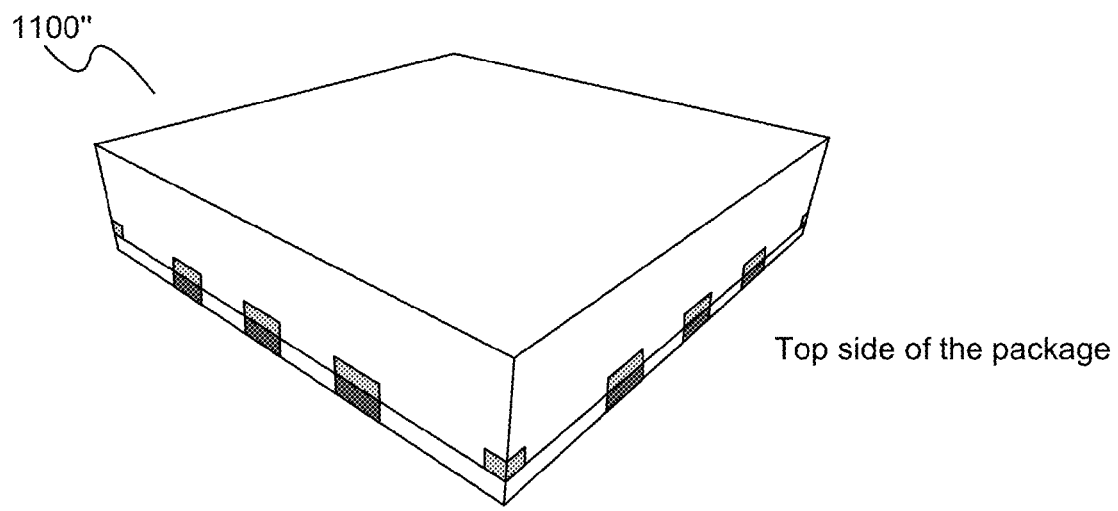
Figure 11C:
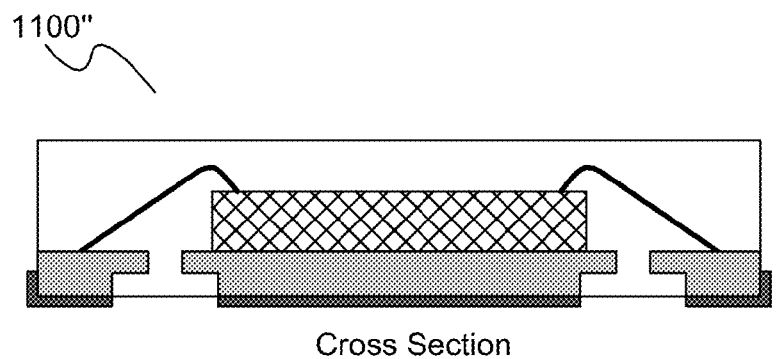

Alternatively, the blade used in the Step 930 has the same thickness as the blade used in the Step 920. In some embodiment, the same blade is used in the Step 920 and the Step 930. FIG. 11C illustrates different views of an exemplary singulated semiconductor device 1100" when the same blade or the blade with the same thickness is used in the Step 930 as in the Step 920. In particular, a bottom side, a top side and a cross section of the semiconductor device 1100" are shown in FIG. 11C. During singulation (the Step 930), unlike the other alternatives, no step is created at each side of the semiconductor device 1100" because the blades used at the Step 920 and the Step 930 have the same thickness. The area of the bottom surface of the singulated semiconductor device 1100" is the same as the area of the top surface of the singulated semiconductor device 1100". During singulation (the Step 930), a third surface of each of contacts is also created. The third surface is perpendicular to and extends from a corresponding first surface to a corresponding second surface. All of the first surface and all of the third surface are plated at the same time at the Step 925. In other words, a continuous plating layer is directly adhered to all of the first surface and all of the third surface. The second surface is not plated as it is exposed by the Step 930.

Figure 12A:
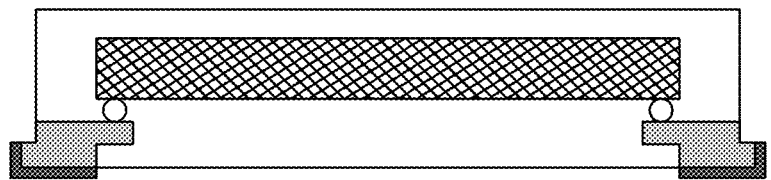
Figure 12B:
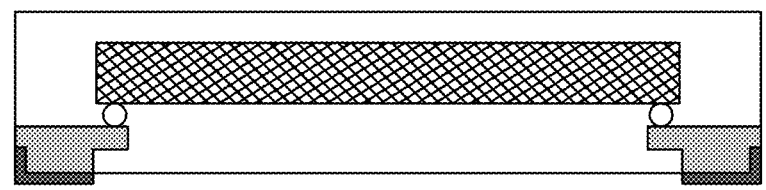
Figure 12C:
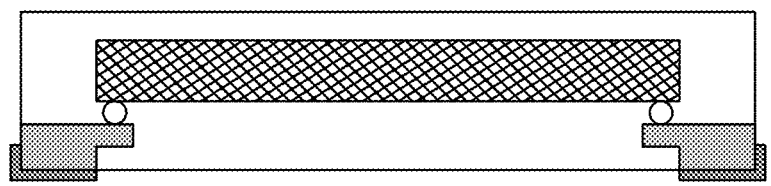

Instead of wirebonds, solder balls can be used to electrically couple a semiconductor die with a plurality of contacts, as illustrated in FIGS. 12A-12C. The semiconductor devices illustrated in FIGS. 12A-12C are flip chip versions of the semiconductor devices illustrated in FIGS. 11A-11C. Furthermore, although a single semiconductor die is described, it is contemplated that a singulated semiconductor device can include a plurality of semiconductor dice stacked therein and electrically coupled with each other and/or a plurality of contacts.

Figure 13:
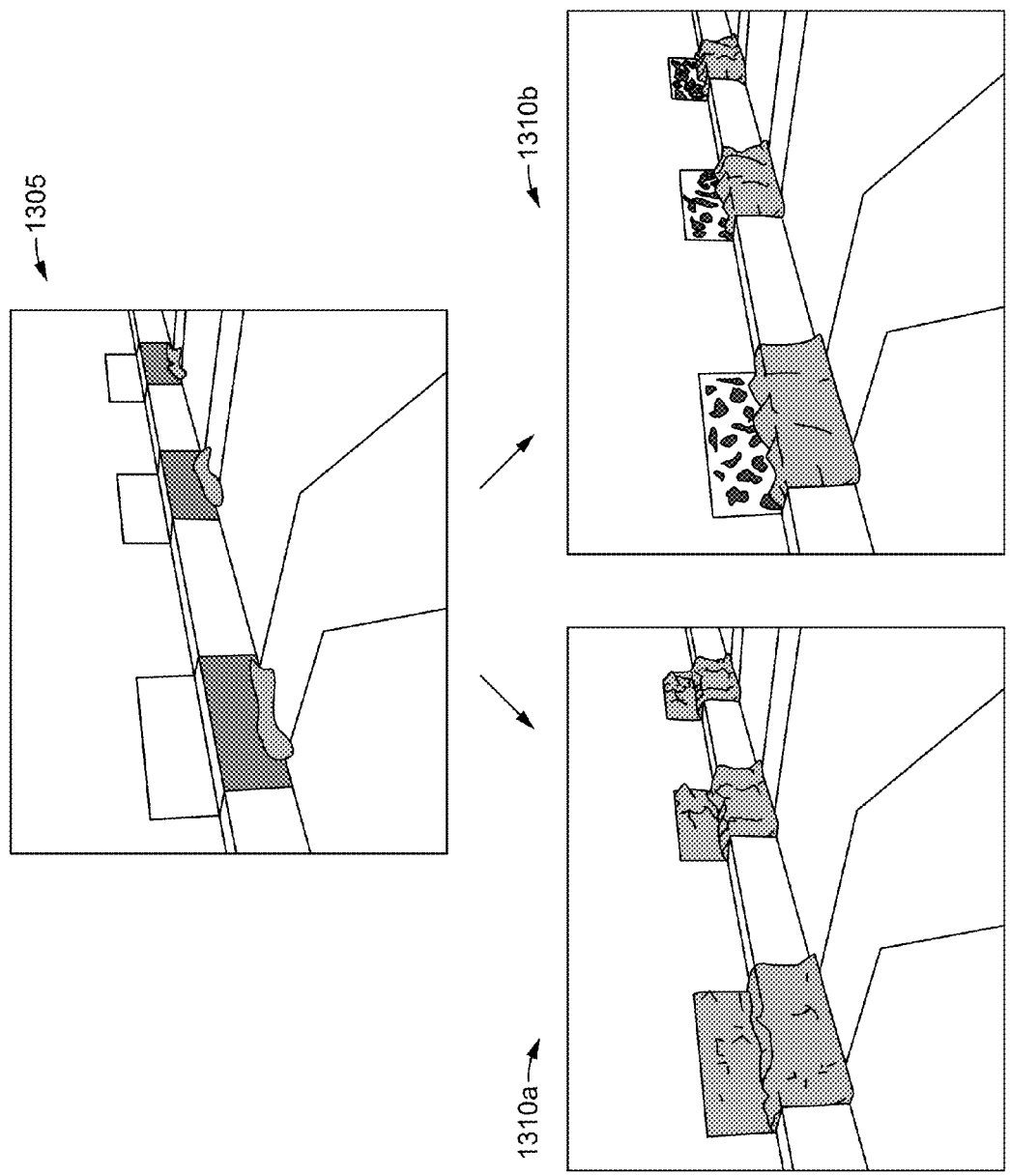
FIG. 13 illustrates another graphical explanation of an application according to some embodiments.

FIG. 13 illustrates another graphical explanation of an application according to some embodiments. The picture 1305 on the left shows a semiconductor package, such as the semiconductor package 1100, on a PCB before reflow. Solder is applied between the plurality of contacts and PCB. After reflow, one of two results can happen. One result, shown in the picture 1310a on the top right, if the exposed copper surfaces of the plurality of contacts are not contaminated, the solder can cover the entire side surfaces of the plurality of contacts during soldering. Another result, shown in the picture 1310b on the bottom right, if the copper surfaces of the plurality of contacts are contaminated, the solder can still partially cover the side surfaces of the plurality of contacts, particularly the areas of the side surfaces that are plated, during soldering. In both of these results, reliability of solder joint is good and can be determined as such by visual inspection.

Dimples

Figure 14A:
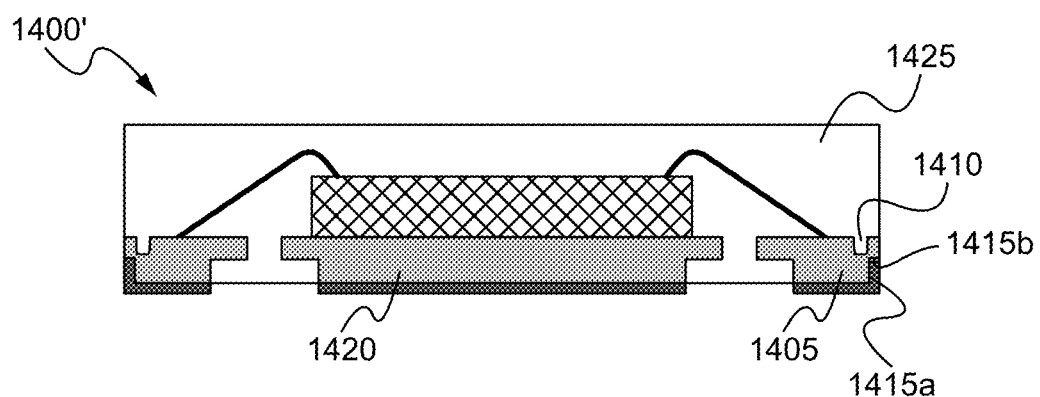

FIG. 14A illustrates another exemplary singulated semiconductor device 1400 according to some embodiments. The singulated semiconductor device 1400 is similarly configured as the singulated semiconductor device 1100' of FIG. 11B, except that the singulated semiconductor device 1400 includes a dimple 1410 that is located on a top surface of each contact 1405, on which an electrical connection to a die attach pad 1420 is formed. As explained elsewhere, an undercut surface of each contact 1405 includes a vertical lower surface 1415a and a horizontal under surface 1415b that are fully platted with matte tin or any suitable solder wettable material. An end of each contact 1405 is exposed from mold compound 1425 after a second pass of a sawing process (e.g., a second partial cut). FIG. 14B illustrates a partial cross-sectional view and a partial lateral view of the singulated semiconductor device 1400 of FIG. 14A.

Figure 14C:
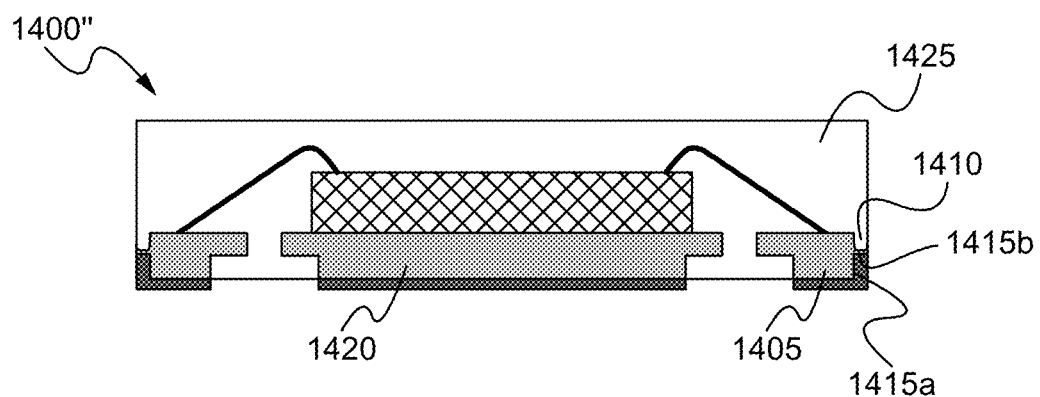

In FIG. 14A, the dimple 1410 is shown located away from the exposed end of the contact 1405 and closer to the die attach pad 1420. However, a dimple can be located anywhere on the contact. For example, the dimple 1410, either partially or entirely, can be located adjacent or at the exposed end of the contact 1405, as illustrated in FIG. 14C. For another example, the dimple 1425 can be located closer to the opposite end (e.g., non-exposed end) of the contact 1405. Other locations of the dimple 1410 are contemplated.

FIG. 15 illustrates a partial cross-sectional view of yet another singulated semiconductor device 1500 according to some embodiments. Unlike the singulated semiconductor device 1400 of FIG. 14A, an undercut surface of the singulated semiconductor device 1500 is a single curved continuous surface that extends from a first edge of an exposed end of a contact to a second edge at a bottom surface of the contact. A dimple is located on a top surface of the contact, on which an electrical connection to a die attach pad is formed. In some embodiments, the undercut surface is formed by selecting a different cutting blade in a first pass of a sawing process (e.g., a first partial cut). Alternatively, the undercut surface is formed by a chemical etching process, such as the one described above.

A dimple ensures good adhesion of the lead (e.g., contacts) to the mold compound and to prevent the lead from separating from the mold compound. In some embodiments, a dimple can be formed such that the whole dimple is located above an undercut surface, such as that illustrated in FIG. 15. Alternatively, a dimple can be formed such that only a partial dimple is located above an undercut surface, such as that illustrated in FIG. 14A. Alternatively, a dimple can be fainted such that the whole dimple is located beyond an undercut surface and towards an interior contact end (e.g., non-exposed end) that can be adjacent to a die attach pad.

Figure 16A:
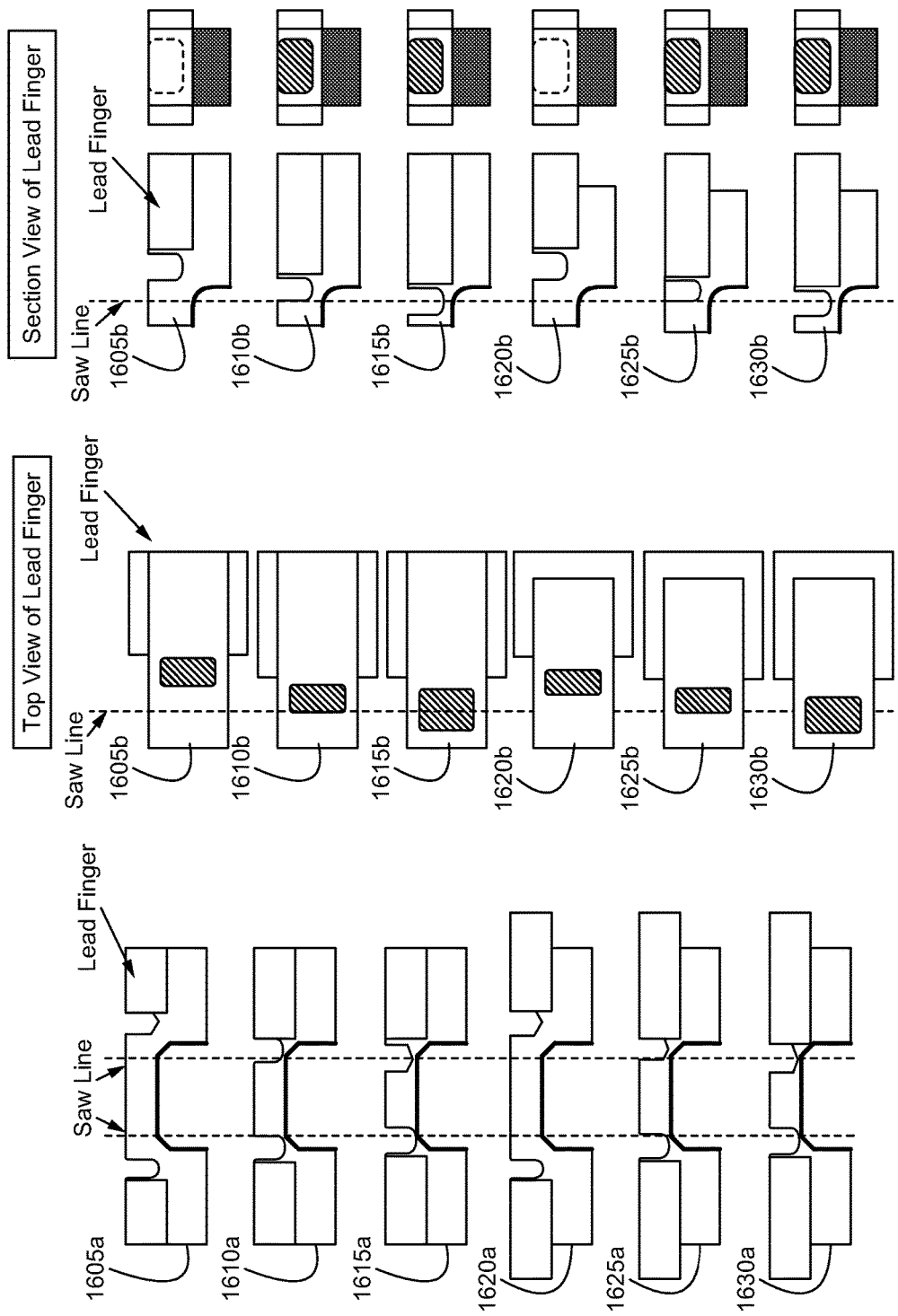
FIGS. 16A-16B illustrate cross-sectional views of exemplary leadframes, including various sizes and positions of dimples in relation to the midpoint of saw cut, and corresponding top and cross-sectional views, respectively, of contacts according to some embodiments.
Figure 16B:
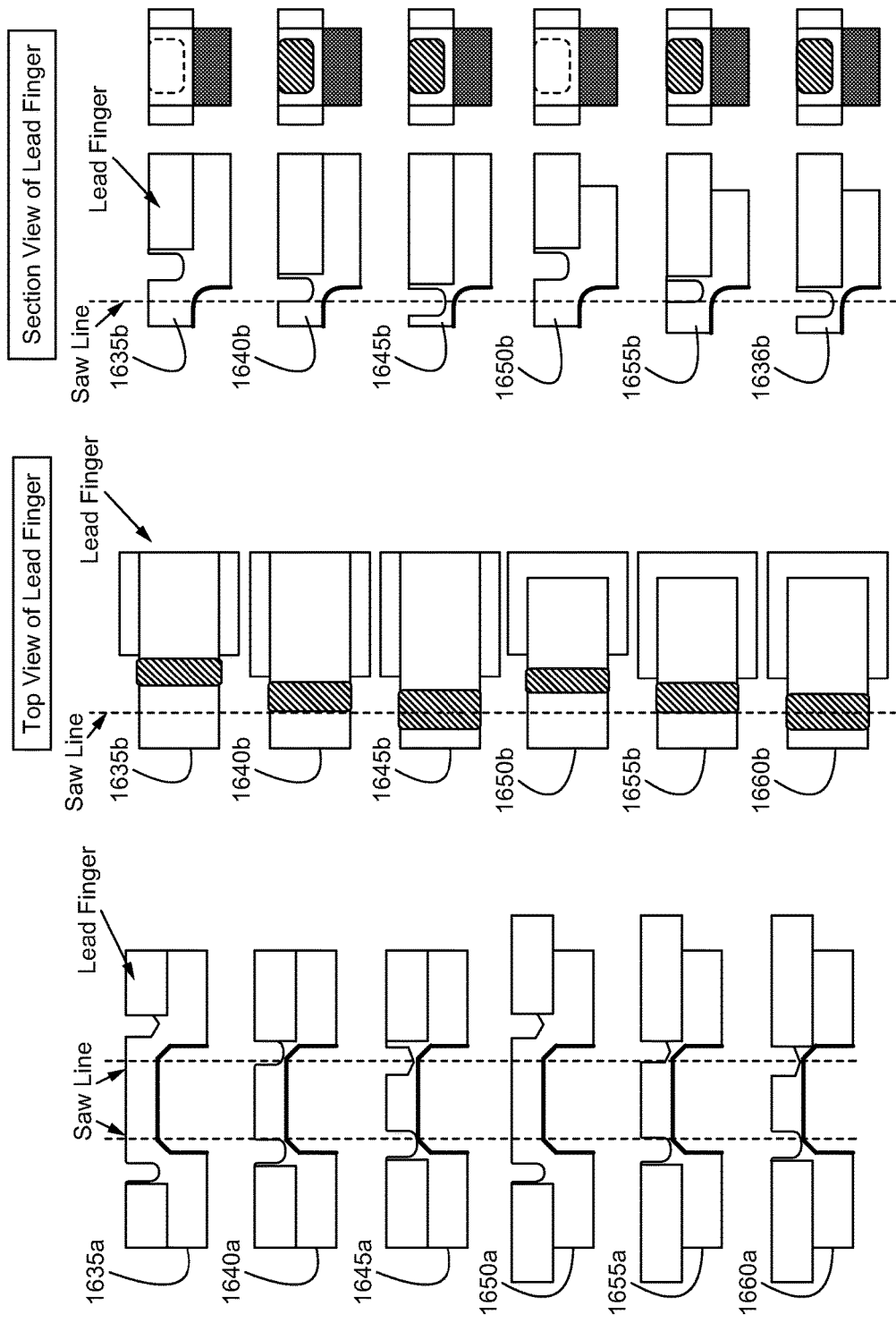

FIGS. 16A-16B illustrate cross-sectional views of exemplary leadframes, including various sizes and positions of dimples in relation to the midpoint of saw cut, and corresponding top and cross-sectional views, respectively, of contacts according to some embodiments. In leadframes 1605a, 1610a, 1615a, 1620a, 1625a, 1630a, 1635a, 1640a, 1645a, 1650a, 1655a, 1660a, the dimples are formed on the top of the leadframe and each forms a locking feature with the molding compound in the finished device or package. In contacts 1605b and 1620b corresponding to the leadframes 1605a and 1620a, respectively, the dimple is located outside the saw cut. In contacts 1610b and 1625b corresponding to the leadframes 1610a and 1625a, respectively, the saw cut coincides with one edge of the dimple. In contacts 1615b and 1630b corresponding to the leadframes 1615a and 1630a, respectively, the dimple is somewhat wider and the saw cut is located near the center of the dimple. Contacts 1635b, 1640b, 1645b, 1650b, 1655b, 1660b are similar to contacts 1605b, 1610b, 1615b, 1620b, 1625b, 1630b, respectively, except that the dimples extend all the way across the contacts.

As demonstrated herein, there is no additional processing step that is required to partially plated contact side surfaces. These partially plated contact side surfaces are plated at the same time as other areas (such as the first surfaces of the contacts and, in some embodiments, the die attach pad) are plated. There is only one plating layer that is applied to the semiconductor package. The semiconductor package with partial plating on its contact side surfaces ensures quality of soldering of the semiconductor package to a substrate. It should be noted that any combination of features (e.g., contacts, dimples, dies, die attach pads, solder balls, bond wires, etc.) can be used as required for the desired package.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A semiconductor package comprising:
   a semiconductor die;
   a formed leadframe having a plurality of contacts, each including an interfacing surface at a bottom of the semiconductor package, an interior surface that is opposite the interfacing surface and an exterior end surface that includes a first portion and a second portion, wherein the first portion of the exterior end surface is non-adjacent to the interface surface;
   a molding compound encapsulating the semiconductor die and at least a portion of each of the plurality of contacts; and
   one continuous plating layer, in a cross-sectional view of the semiconductor package, directly adhering to the formed leadframe at both the interfacing surface of the formed leadframe and at least an area of the second portion of the exterior end surface of the formed leadframe.

2. The semiconductor package of claim 1, wherein the formed leadframe further includes:
   tie bars; and
   die attach pad coupled with the tie bars.

3. The semiconductor package of claim 2, wherein, at a back side of the semiconductor package, the die attach pad is also plated.

4. The semiconductor package of claim 3, wherein the semiconductor die is electrically coupled with the interior surface of the contact via wirebonds.

5. The semiconductor package of claim 1, wherein the semiconductor die is electrically coupled with the interior surface of the contact via solder balls.

6. The semiconductor package of claim 1, wherein the first portion of the exterior end surface is exposed and the interface surface is plated.

7. The semiconductor package of claim 6, further comprising a step located at each side of the semiconductor device.

8. The semiconductor package of claim 7, wherein the step runs the full length of each side of the semiconductor package.

9. The semiconductor package of claim 8, wherein the second portion of the exterior end surface is located at the step and further includes a first subportion and a second subportion of the second portion of the exterior end surface, wherein the first subportion of the second portion of the exterior end surface is perpendicular to and extends from the first portion of the exterior end surface, and the second subportion of the second portion of the exterior end surface is perpendicular to and extends from the first subportion of the second portion of the exterior end surface to the interfacing surface.

10. The semiconductor package of claim 9, wherein the area of a bottom surface of the semiconductor package is greater than the area of a top surface of the semiconductor package, and wherein the first subportion of the second portion of the exterior end surface is exposed and the second subportion of the second portion of the exterior end surface is plated.

11. The semiconductor package of claim 10, further comprising a dimple formed on a top side of each contact.

12. The semiconductor package of claim 9, wherein the area of a top surface of the semiconductor package is greater than the area of a bottom surface of the semiconductor package, and the first subportion and the second subportion of the second portion of the exterior end surface are both plated.

13. The semiconductor package of claim 12, further comprising a dimple formed on a top side of each contact.

14. The semiconductor package of claim 8, wherein the second portion of the exterior end surface is located at the step and is a curved continuous surface and is plated.

15. The semiconductor package of claim 14, further comprising a dimple formed on a top side of each contact.

16. The semiconductor package of claim 6, wherein the second portion of the exterior end surface is plated and extends from the first portion of the exterior end surface to the interfacing surface.

17. The semiconductor package of claim 16, further comprising a dimple formed on a top side of each contact.

18. A semiconductor package comprising:
- a semiconductor die;
- a formed leadframe having a plurality of contacts, each including an interfacing surface at a bottom of the semiconductor package, an interior surface that is opposite the interfacing surface and an exterior end surface that includes a first portion and a second portion, wherein the first portion of the exterior end surface is non-adjacent to the interface surface;
- a molding compound encapsulating the semiconductor die and at least a portion of each of the plurality of contacts; and
- one continuous plating layer, in a cross-sectional view of the semiconductor package, directly adhering to the interfacing surface and the entirety of the second portion of the exterior end surface.

19. The semiconductor package of claim 18, wherein the second portion of the exterior end surface includes a first subportion and a second subportion of the second portion of the exterior end surface, wherein the first subportion of the second portion of the exterior end surface is perpendicular to and extends from the first portion of the exterior end surface, and the second subportion of the second portion of the exterior end surface is perpendicular to and extends from the first subportion of the second portion of the exterior end surface to the interfacing surface.

20. The semiconductor package of claim 19, wherein the width of the package at the top of the package from one end that is furthest from the center of the semiconductor package in a first direction to another end that is furthest from the center the semiconductor package in a second direction opposite the first direction and the width of the package of the bottom of the package from one end that is furthest from the center of the semiconductor package in the first direction to another end that is furthest from the center of the semiconductor package in the second direction are different.

21. The semiconductor package of claim 20, further comprising a dimple formed in an area of the formed leadframe, wherein the area is outside a contacting area of the semiconductor die with the leadframe.

* * * * *